United States Patent
Fimland et al.

(10) Patent No.: US 11,239,391 B2
(45) Date of Patent: Feb. 1, 2022

(54) NANOSTRUCTURE

(71) Applicant: NORWEGIAN UNIVERSITY OF SCIENCE AND TECHNOLOGY (NTNU), Trondheim (NO)

(72) Inventors: Bjørn Ove Myking Fimland, Trondheim (NO); Helge Weman, Trondheim (NO); Dingding Ren, Trondheim (NO)

(73) Assignee: NORWEGIAN UNIVERSITY OF SCIENCE AND TECHNOLOGY (NTNU), Trondheim (NO)

( * ) Notice: Subject to any disclaimer, the term of this patent is extended or adjusted under 35 U.S.C. 154(b) by 0 days.

(21) Appl. No.: 16/604,397

(22) PCT Filed: Apr. 10, 2018

(86) PCT No.: PCT/EP2018/059205
§ 371 (c)(1),
(2) Date: Oct. 10, 2019

(87) PCT Pub. No.: WO2018/189205
PCT Pub. Date: Oct. 18, 2018

(65) Prior Publication Data
US 2020/0161504 A1    May 21, 2020

(30) Foreign Application Priority Data
Apr. 10, 2017 (GB) ...................................... 1705755

(51) Int. Cl.
*H01L 33/30* (2010.01)
*H01L 33/00* (2010.01)
(Continued)

(52) U.S. Cl.
CPC .......... *H01L 33/30* (2013.01); *H01L 33/0066* (2013.01); *H01L 33/06* (2013.01)

(58) Field of Classification Search
CPC ..... H01L 33/30; H01L 33/0066; H01L 33/06; H01L 33/24; H01L 33/16; H01L 33/08
See application file for complete search history.

(56) References Cited

U.S. PATENT DOCUMENTS

| 4,213,801 A | 7/1980 | Johnston |
| 6,235,243 B1 | 5/2001 | Fleischer et al. |

(Continued)

FOREIGN PATENT DOCUMENTS

| CN | 101504961 A | 8/2009 |
| CN | 101710567 A | 5/2010 |

(Continued)

OTHER PUBLICATIONS

Office Action relating to U.S. Appl. No. 15/971,278, dated Nov. 15, 2019.

(Continued)

*Primary Examiner* — David Vu
(74) *Attorney, Agent, or Firm* — Meunier Carlin & Curfman LLC

(57) ABSTRACT

A composition of matter comprising at least one nanostructure grown epitaxially on an optionally doped β-$Ga_2O_3$ substrate, wherein said nanostructure comprises at least one group III-V compound.

17 Claims, 7 Drawing Sheets

(51) Int. Cl.
*H01L 33/06* (2010.01)
*H01L 33/24* (2010.01)

(56) References Cited

U.S. PATENT DOCUMENTS

| | | | |
|---|---|---|---|
| 7,335,908 B2 | 2/2008 | Samuelson | |
| 7,442,575 B2 | 10/2008 | Coffer et al. | |
| 7,594,982 B1 | 9/2009 | Sager et al. | |
| 7,608,147 B2 | 10/2009 | Samuelson et al. | |
| 7,608,472 B2 * | 10/2009 | Ichinose | C30B 15/00 438/46 |
| 7,641,818 B2 | 1/2010 | Nakayama et al. | |
| 7,911,035 B2 | 3/2011 | Seifert et al. | |
| 7,965,960 B2 | 6/2011 | Kim et al. | |
| 8,043,942 B2 | 10/2011 | Lee et al. | |
| 8,080,182 B2 | 12/2011 | Nakayama et al. | |
| 8,212,335 B2 | 7/2012 | Fujioka | |
| 8,417,153 B2 | 4/2013 | Kim et al. | |
| 8,440,350 B1 | 5/2013 | Verbrugge et al. | |
| 8,455,284 B2 | 6/2013 | Seong et al. | |
| 8,916,850 B2 | 12/2014 | Fujioka | |
| 9,000,449 B2 | 4/2015 | Fujioka et al. | |
| 9,577,176 B1 | 2/2017 | Fong et al. | |
| 9,666,673 B2 | 5/2017 | Yi et al. | |
| 9,966,257 B2 | 5/2018 | Weeman et al. | |
| 9,978,808 B2 * | 5/2018 | Schneider, Jr. | H01L 33/0075 |
| 9,985,150 B2 | 5/2018 | Yoshimuta et al. | |
| 10,243,104 B2 | 3/2019 | Weeman et al. | |
| 10,347,781 B2 | 7/2019 | Weman et al. | |
| 10,347,791 B2 | 7/2019 | Kim et al. | |
| 10,472,734 B2 | 11/2019 | Fimland et al. | |
| 10,957,816 B2 | 3/2021 | Bayram et al. | |
| 2002/0175408 A1 | 11/2002 | Majumdar et al. | |
| 2003/0044608 A1 | 3/2003 | Yoshizawa et al. | |
| 2004/0075464 A1 | 4/2004 | Samuelson et al. | |
| 2005/0217565 A1 | 10/2005 | Lahreche | |
| 2005/0217656 A1 | 10/2005 | Bender | |
| 2006/0054909 A1 | 3/2006 | Shin | |
| 2006/0125056 A1 | 6/2006 | Samuelson et al. | |
| 2006/0188774 A1 | 8/2006 | Niu et al. | |
| 2007/0177138 A1 | 8/2007 | Esmaeili | |
| 2007/0177139 A1 | 8/2007 | Kamins et al. | |
| 2007/0212538 A1 | 9/2007 | Niu | |
| 2007/0240757 A1 | 10/2007 | Ren et al. | |
| 2008/0036038 A1 | 2/2008 | Hersee et al. | |
| 2008/0081439 A1 | 4/2008 | Coffer et al. | |
| 2008/0118999 A1 | 5/2008 | Komada | |
| 2008/0142066 A1 | 6/2008 | Plissonnier et al. | |
| 2008/0142926 A1 | 6/2008 | Seifert et al. | |
| 2008/0191317 A1 | 8/2008 | Cohen et al. | |
| 2009/0057649 A1 | 3/2009 | Sutter et al. | |
| 2009/0159907 A1 | 6/2009 | Wang | |
| 2009/0176159 A1 | 7/2009 | Zhamu et al. | |
| 2009/0191317 A1 | 7/2009 | Lin | |
| 2009/0200540 A1 | 8/2009 | Bjoerk et al. | |
| 2009/0235862 A1 | 9/2009 | Cha et al. | |
| 2009/0293946 A1 | 12/2009 | Lin et al. | |
| 2010/0029037 A1 | 2/2010 | Tokuda et al. | |
| 2010/0035412 A1 | 2/2010 | Samuelson et al. | |
| 2010/0155702 A1 | 6/2010 | Wernersson et al. | |
| 2010/0171096 A1 | 7/2010 | Sutter et al. | |
| 2010/0200839 A1 | 8/2010 | Okai et al. | |
| 2010/0252808 A1 | 10/2010 | Samuelson et al. | |
| 2010/0314617 A1 | 12/2010 | Ito et al. | |
| 2010/0320445 A1 | 12/2010 | Ogihara et al. | |
| 2010/0327258 A1 | 12/2010 | Lee et al. | |
| 2011/0030772 A1 | 2/2011 | Veerasamy | |
| 2011/0030991 A1 | 2/2011 | Veerasamy et al. | |
| 2011/0081500 A1 | 4/2011 | Zhao et al. | |
| 2011/0121264 A1 | 5/2011 | Choi et al. | |
| 2011/0129675 A1 | 6/2011 | Choi et al. | |
| 2011/0133061 A1 | 6/2011 | Yu et al. | |
| 2011/0148284 A1 | 6/2011 | Nagao et al. | |
| 2011/0163292 A1 | 7/2011 | Wang et al. | |
| 2011/0168256 A1 | 7/2011 | Wang et al. | |
| 2011/0174626 A1 | 7/2011 | Hamada et al. | |
| 2011/0175059 A1 | 7/2011 | Kahen et al. | |
| 2011/0177683 A1 | 7/2011 | Kahen et al. | |
| 2011/0203651 A1 | 8/2011 | Nagao et al. | |
| 2011/0220171 A1 | 9/2011 | Mathai et al. | |
| 2011/0220864 A1 | 9/2011 | Kim et al. | |
| 2011/0239932 A1 | 10/2011 | Chang et al. | |
| 2011/0240099 A1 | 10/2011 | Ellinger et al. | |
| 2011/0254034 A1 | 10/2011 | Konsek et al. | |
| 2011/0272723 A1 | 11/2011 | Ha et al. | |
| 2011/0313194 A1 | 12/2011 | Lee et al. | |
| 2012/0021554 A1 | 1/2012 | Neel et al. | |
| 2012/0041246 A1 | 2/2012 | Scher et al. | |
| 2012/0056237 A1 | 3/2012 | Choi et al. | |
| 2012/0068122 A1 | 3/2012 | Kranbuehl et al. | |
| 2012/0068153 A1 | 3/2012 | Seong et al. | |
| 2012/0068157 A1 | 3/2012 | Kub et al. | |
| 2012/0087422 A1 | 4/2012 | Zhou et al. | |
| 2012/0090057 A1 | 4/2012 | Cohen et al. | |
| 2012/0132930 A1 | 5/2012 | Young et al. | |
| 2012/0135158 A1 | 5/2012 | Freer et al. | |
| 2012/0141799 A1 | 6/2012 | Kub et al. | |
| 2012/0145549 A1 | 6/2012 | Cho et al. | |
| 2012/0192931 A1 | 8/2012 | Jeon et al. | |
| 2012/0211073 A1 | 8/2012 | Nagao et al. | |
| 2012/0241192 A1 | 9/2012 | Cai et al. | |
| 2012/0270054 A1 | 10/2012 | Hong et al. | |
| 2013/0026468 A1 | 1/2013 | Yoshimuta et al. | |
| 2013/0137220 A1 | 5/2013 | Matsubara et al. | |
| 2013/0153860 A1 | 6/2013 | Kim et al. | |
| 2013/0158322 A1 | 6/2013 | Nyce et al. | |
| 2013/0187128 A1 | 7/2013 | Yi et al. | |
| 2013/0207075 A1 | 8/2013 | Myers | |
| 2013/0213470 A1 | 8/2013 | Yi et al. | |
| 2013/0221322 A1 | 8/2013 | Ohlsson et al. | |
| 2013/0221385 A1 | 8/2013 | Shibata et al. | |
| 2013/0231470 A1 | 9/2013 | Iacobelli | |
| 2013/0280894 A1 | 10/2013 | Lee et al. | |
| 2013/0311363 A1 | 11/2013 | Ramaci et al. | |
| 2013/0334497 A1 | 12/2013 | Weman et al. | |
| 2014/0014171 A1 | 1/2014 | Alam | |
| 2014/0077156 A1 | 3/2014 | Bavencove | |
| 2014/0151826 A1 | 6/2014 | Keiber et al. | |
| 2014/0161730 A1 | 6/2014 | Sitharaman et al. | |
| 2014/0182668 A1 | 7/2014 | Pacific et al. | |
| 2014/0231745 A1 | 8/2014 | Northrup | |
| 2014/0252316 A1 | 9/2014 | Yan et al. | |
| 2014/0293164 A1 | 10/2014 | Kim et al. | |
| 2015/0076450 A1 | 3/2015 | Weman et al. | |
| 2015/0076535 A1 | 3/2015 | Choung | |
| 2015/0194549 A1 | 7/2015 | Weman et al. | |
| 2015/0255677 A1 | 9/2015 | Dechoux et al. | |
| 2015/0311363 A1 | 10/2015 | Park et al. | |
| 2015/0364646 A1 | 12/2015 | Morishima et al. | |
| 2016/0005751 A1 | 1/2016 | Tsui et al. | |
| 2016/0013365 A1 | 1/2016 | Chun et al. | |
| 2017/0018685 A1 | 1/2017 | Cho et al. | |
| 2018/0204976 A1 | 7/2018 | Kim | |
| 2018/0204977 A1 | 7/2018 | Dheeraj | |

FOREIGN PATENT DOCUMENTS

| | | |
|---|---|---|
| CN | 102254969 A | 11/2011 |
| CN | 102376817 | 3/2012 |
| CN | 103050498 A | 4/2013 |
| CN | 103903973 | 7/2014 |
| CN | 106149058 A | 11/2016 |
| EP | 164243 B1 | 6/1995 |
| EP | 527259 B1 | 10/1995 |
| EP | 1829141 | 9/2007 |
| EP | 1952467 | 8/2008 |
| EP | 2267796 | 12/2010 |
| GB | 2517186 | 2/2015 |
| JP | 11090225 A | 4/1999 |
| JP | 2002280610 | 9/2002 |
| JP | 2007051327 | 3/2007 |
| JP | 2009010012 | 1/2009 |
| JP | 2010006670 A | 1/2010 |
| JP | 2010208925 A | 9/2010 |

(56) References Cited

FOREIGN PATENT DOCUMENTS

| | | |
|---|---|---|
| JP | 2012250868 A | 12/2012 |
| JP | 2013129548 | 7/2013 |
| JP | 2014120548 | 6/2014 |
| KR | 969127 B1 | 7/2010 |
| KR | 20100094228 A | 8/2010 |
| KR | 20120036129 | 10/2010 |
| KR | 20110061492 A | 6/2011 |
| KR | 20120035841 | 6/2011 |
| KR | 1197416 B1 | 4/2012 |
| KR | 20120083084 | 7/2012 |
| KR | 20120092431 | 8/2012 |
| KR | 1184353 B1 | 9/2012 |
| KR | 2014077962 A | 6/2014 |
| KR | 2014092395 A | 7/2014 |
| KR | 1467118 B1 | 12/2014 |
| KR | 2015023533 A | 3/2015 |
| KR | 101517551 | 5/2015 |
| KR | 2015102703 A | 9/2015 |
| KR | 2016002323 A | 1/2016 |
| KR | 2016033145 A | 3/2016 |
| KR | 1627491 B1 | 6/2016 |
| KR | 1646440 B1 | 8/2016 |
| KR | 2016146665 A | 12/2016 |
| KR | 2016146666 A | 12/2016 |
| KR | 2017008724 A | 1/2017 |
| KR | 2017009819 A | 1/2017 |
| WO | 2006062947 | 6/2006 |
| WO | 2007061945 | 4/2009 |
| WO | 2010056064 | 5/2010 |
| WO | 2010056061 | 8/2010 |
| WO | 2010096035 | 8/2010 |
| WO | 2011016837 | 2/2011 |
| WO | 2011081440 | 7/2011 |
| WO | 2011090863 | 7/2011 |
| WO | 2011160051 | 12/2011 |
| WO | 2012029381 | 3/2012 |
| WO | 2012080252 | 6/2012 |
| WO | 2013104723 | 7/2013 |
| WO | 2013106411 | 7/2013 |
| WO | 2013121289 | 8/2013 |
| WO | 2013190128 | 12/2013 |
| WO | 2014202796 | 12/2014 |
| WO | 2017009394 A1 | 1/2017 |

OTHER PUBLICATIONS

Non-Final Office Action relating to U.S. Appl. No. 15/749,228, dated Dec. 4, 2019.
Jiang, Yeping et al., "Fermi-Level Tuning of Epitaxial Sb2Te3 Thin Films on Graphene by Regulating Intrinsic Defects and Substrate Transfer Doping", Physical Review Letters, 2012, 108:066809.
Park, et al., "Hybrid Semiconductor Nanostructures with Graphene Layers", 2012, Chapter 6.
Virojanadara, et al., "Large homogeneous mono-/bi-ayer graphene on 6H-SiC (0001) and buffer layer elimination", J Phys D: Appl Phys. 2010, 43, 374010.
Yoo, et al., "Microstructural defects in GaN thin films grown on chemically vapor-deposited graphene layers", Applied Physics Letters 2013, 102 (5): 051908-1-051908-3.
"Nanocomposite Thin Films and Coatings-Processing, Properties, Performance, Table 2.1. The Physical, Mechanical and Thermal Properties of Hard Materials, 2007, World Scientific."
Final Office Action relating to U.S. Appl. No. 15/744,467, dated Jan. 7, 2020.
Final Office Action relating to U.S. Appl. No. 15/749,228, dated Aug. 13, 2019.
Notice of Allowance relating to U.S. Appl. No. 15/749,228, dated Mar. 25, 2020.
International Search Report and Written Opinion in PCT/EP2018/059205, dated Jun. 21, 2018. 14 pages.
Villora et al. "-Ga2O3 and single-crystal phosphors for high-brightness white LEDs & LDs, and -Ga2O3 potential for next generation of power devices". National Institute for Materials Science. 12 pages.
Ohira et al. Fabrication of hexagonal GaN on the surface of h—Ga2O3 single crystal by nitridation with NH3. Thin Solid Films 496 (2006) 53-57.
Muhammed et al. "High-quality III-nitride films on conductive, transparent (201)-oriented β—Ga2O3 using a GaN buffer layer". Scientific Reports. Jul. 14, 2016. 10 pages.
Notice of Allowance relating to U.S. Appl. No. 15/971,278, dated Jul. 22, 2020.
Park, Jun Beom et al., "Metal catalyst-assisted growth of GaN nanowires on graphene films for flexible photocatalyst applications", Current Applied Physics, 2014, 14, 1437-1442.
Non-Final Office Action relating to U.S. Appl. No. 16/456,591, dated Jul. 30, 2020.
Munshi et al. "Vertically Aligned GaAs Nanowries on Graphite and Few-Layer Graphene: Generic Model and Epitaxial Growth", Nano Lett., 2012, 12, pp. 4570-4576.
Nayak et al. "Surface nitriding of graphite substrate by plasma focus device towards synthesis of carbon nitride coating". Surface and Coating Technology 145 (2001), pp. 8-15.
Bonaccorso et al., Graphene photonics and optoelectronics, Nature Photonics, 2010, 4, 611.
Boukhvalov et al., Chemical functionalization of graphene with defects, Nano Letters, 2008, 8(12), 4373-4379.
Chung et al., Transferable GaN Layers Grown on ZnO-Coated Graphene Lyers for Optoelectronic Devices, Science, 2010, 330, 655-657.
Cohin et al. Growth of Vertical GaAs Nanowires on an Amorphous Substrate via a Fiber-Textured Si Platform, Nano letters 2013, 13, 2743.
Colombo et al., Ga-assisted catalyst-free growth mechanism of GaAs nanowires by molecular beam epitaxy, Phys Rev B, 2008, 77, 155326.
Dheeraj et al., Controlling crystal phases in GaAs nanowires grown by Au-assisted molecular beam epitaxy, Nanotechnology, 2013, 24, 015601.
Gao et al., Repeated growth and bubbling transfer of graphene with millimetre-size single-crystal grains using platinum, Nat Commun 2012, 3, 699.
Heib et al., Growth mechanisms and optical properties of GaAs-based semiconductor microstructures by selective area epitaxy, Journal of Crystal Growth, 2008, 310, 1049-1056.
Hong et al., Controlled van der Waals Heteroepitaxy of InAs Nanowires on Carbon Honeycomb Lattices, ACS Nano, 2011, 5(9), 7576-7584.
Huh et al., UV/Ozone-Oxidized Large-Scale Graphene Platform with Large Chemical Enhancement in Surface-Enhanced Raman Scattering, ACS Nano, 2011, 5(12), 9799-9806.
Kent et al., Deep ultraviolet emitting polarization induced nanowire light emitting diods with AlxGa(1-x)N active regions, Nanotechnology, 2014, 25, 455201.
Kim et al., Realization of a high mobility dual-gated graphene field-effect transistor with Al2O3 dielectric, Appl. Phys. Lett. 2009, 94, 062107.
Kim et al., Vertically aligned ZnO nanostructures grown on graphene layers, Applied Physics Letters, 2009, 95, 213101-1 through 213101-3.
Kishino et al., Improved Ti-mask selective-area growth (SAG) by rf-plasma-assisted molecular beam epitaxy demonstrating extremely uniform GaN nanocolumn arrays, J. Crystal Growth 2009, 311, 2063-68.
Kneissl, Advances in group III-nitride-based deep UV light-emitting diode technology, Semiconductor Sci and Tech, 2011, 26, 014036.
Mariani et al., Patterned radial GaAs nanopillar solar cells, Nano Letters, 2011, 11, 2490-2494.
Marzouki et al., Structural and optical characterizations of nitrogen doped ZnO nanowires grown by MOCVD, Materials Letters, 2010, 64, 2112-2114.
Mohseni et al., Hybrid GaAs-Nanowire Carbon-Nanotube Flexible Photovoltaics, IEEE Journal of Selected Topics in Quantum Electrionics, 201, 17(4), 1070-1077.

(56) References Cited

OTHER PUBLICATIONS

Mulyana et al., Reversible Oxidation of Graphene Through Ultraviolet/Ozone Treatment and Its Nonthermal Reduction through Ultraviolet Irradiation, J Phys Chem C, 2014, 118(47), 27372-27381.

Mulyana et al., Thermal reversibility in electrical characteristics of ultraviolet/ozone-treated graphene, Applied Physics Letters, 2013, 103, 063107.

Munshi et al., Position-Controlled Uniform GaAs Nanowires on Silicon using Nanoimprint Lithography, Nano Letters, 2014, 14, 960-966.

Musolino et al. Compatibility of the selective area growth of GaN nanowires on AlN-buffered Si substrates with the operation of light emitting diodes. Nanotechnology 2015, 26, 085605.

Nevidomskyy et al., Chemically active substitutional nitrogen impurity in carbon nanotubes, Phys Rev Lett, 91, 105502.

Nistor et al., The role of chemistry in graphene doping for carbon-based electronics, ACS Nano, 2011, 5(4), 3096-3103.

Paek et al., MBE-VLS growth of GaAs nanowires on (111)Si substrate, Physica Status Solidi (C), 2008, 5(9), 2740-2742.

Park et al., Inorganic nanostructures grown on graphene layers, Nanoscale, 2011, 3(9), 3522-3533.

Patsha et al., Growth of GaN nanostructures on graphene, Nanoscience, 2011 International Conference on Enginieering and Technology (ICONSET), pp. 553-555.

Peng et al., Control of growth orientation of GaN nanowires, Chemical Physics Letters, 2002, 359, 241-245.

Pierret et al., Generic nanp-imprint process for fabrication of nanowire arrays, Nanotechnology, 21(6), 065305.

Pela et al. "Accurate band gaps of AlGaN, InGaN, and AlInN alloys calculations based on LDA-1/2 approach." Appl Phys Lett, 2011, 98, 151907.

Plissard et al., Gold-free growth of GaAs nanowires on silicon: arrays and polytypism, Nanotechnology, 2010, 21, 1-8.

Plissard et al., High yield of self-catalyzed GaAs nanowire arrays grown on silicon via gallium droplet positioning, Nanotechnology, 2011, 22, 275602.

Sun et al., Compounds Semiconductor Nanowire Solar Cells, IEEE Journal of Selected Topics in Quantum Electronics, 2011, 17)(4), 1033-1049.

Toko et al. Selective formation of large-grained (100)- or (111)-oreinted Si on glass by Al-induced layer exchange. J Appl Phys, 2014, 115, 094301.

Tomioka et al., Control of InAs Nanowire Growth Directions on Si, Nano Letters, 2008, 8(10), 3475-3480.

Wang et al., Growth of Nanowires, Materials Science and Engineering, 2008, 60, 1-51.

Wang et al., Nanocrystal growth on graphene in various degrees of oxidation, Journal of American Chemical Society, 2010, 132, 3270-3271.

Yamaguchi et al., Passivating chemical vapor deposited graphene with metal oxides for transfer and transistor fabrication processes, Appl Phys Lett, 2013, 102, 143505.

Yin et al., Application of CVD graphene as transparent front electrode in Cu(In, GA)Se2 solar cell, 2014 IEEE 40th Photovoltaic Specialist Conference (PVSC), pp. 1740-1744, XP032660257.

Yoon et al., Vertical epitaxial Co5Ge7 nanowires and nanobelt arrays on a thin graphitic layer for flexible Field Emission Displays, Advanced Materials, 2009, 21, 4979-4982.

Yu et al., Electronic properties of nitrogen-atom-adsorbed graphene nanoribbons with armchair edges, IEEE transactions on Nanotechnology, 2010, 9(2).

Zhao et al., Aluminum nitride nanowire light emitting diodes: Breaking the fundamental bottleneck of deep ultraviolet light sources, Scientific Reports, 2015, 5, 8332.

International Search Report and Written Opinion dated Oct. 19, 2016, in related application PCT/EP2016/066694 (12 pages).

International Search Report and Written Opinion dated Oct. 14, 2016, in related application PCT/EP2016/006696 (11 pages).

International Search Report and Written Opinion dated Jan. 11, 2017, in related application PCT/EP2016/068350 (16 pages).

Office Action issued in connection to U.S. Appl. No. 15/744,467, dated Dec. 2, 2020.

Office Action issued in connection to U.S. Appl. No. 16/456,591, dated Nov. 30, 2020.

Office Action issued in connection to U.S. Appl. No. 16/456,591, dated May 7, 2021.

Office Action issued in connection to U.S. Appl. No. 16/504,862, dated Nov. 18, 2020.

Office Action issued in connection to U.S. Appl. No. 16/504,862, dated May 25, 2021.

Office Action issued in connection to U.S. Appl. No. 16/679,832, dated Jul. 22, 2021.

Office Action issued in connection to U.S. Appl. No. 16/504,868, dated Jul. 23, 2021.

Office Action issued for U.S. Appl. No. 15/744,467, filed Sep. 17, 2021.

* cited by examiner

| Characteristics | |
|---|---|
| Crystal structure | Monoclinic<br>a=12.23Å, b=3.04Å, c=5.8Å<br>β=103.7° |
| Density | $5.95 \times 10^3$ kg/m$^3$ |
| Vickers hardness | (101): 9.7 GPa<br>($\bar{2}$01): 12.5 GPa |
| Young's modulus | 230 GPa |
| Melting point | 1725°C |
| Thermal conductivity | [100]: 13.6 W/m·K<br>[010]: 22.8 W/m·K |
| Specific heat capacity | $0.49 \times 10^3$ J/kg·K |
| Bandgap | 4.8 ~ 4.9 eV |
| Refractive index | 1.97 @450 nm |

NANOSTRUCTURE

CROSS-REFERENCE TO RELATED APPLICATIONS

This application is a national stage application filed under 35 U.S.C. § 371 of PCT/EP2018/059205, filed Apr. 10, 2018, which claims the benefit of priority to Great Britain Patent Application No. 1705755.5, filed Apr. 10, 2017, the contents of each are incorporated herein by reference in their entireties.

This invention concerns a process for growing semiconductor nanostructures epitaxially on β-$Ga_2O_3$ substrates, e.g. using molecular beam epitaxy or metal organic vapour phase epitaxy (MOVPE) techniques to grow nanostructures epitaxially on β-$Ga_2O_3$ substrates. The resulting nanostructures form a further aspect of the invention. The nanostructures are preferably semiconductor materials and have wide ranging applications in, for example, the electronics industry or in solar cell applications. The use of the composition in light-emitting diodes (LEDs) and photodetectors are especially preferred.

BACKGROUND

Wide band-gap GaN and related ternary and quarternary III-N semiconductor compounds have been recognized to be among the most important semiconductors for electronics and optoelectronic devices due to their remarkable optical, electrical and physical properties. Nevertheless, the commercialization of GaN-based devices is hampered by limited substrate availability. Si and sapphire ($Al_2O_3$) have been traditionally employed for their low-cost and good thermal conductivity but these materials have a relatively large lattice- and thermal expansion-mismatch with GaN.

β-$Ga_2O_3$ substrates have recently emerged as a substrate for III-nitride LED and power devices due to their high transparency to light into the deep UV (band gap ~4.8 eV (260 nm)) as well as being highly n-type conductive. β-$Ga_2O_3$ may therefore represent an alternative to sapphire ($Al_2O_3$) substrates that are used for most of today's III-nitride LEDs and power devices. Recently, E. G. Villora et al, proposes β-$Ga_2O_3$ as a substrate for heteroepitaxial deposition of GaN and the application of these materials in LEDs and power devices (Proc. SPIE 8987 89871U (2014)). The GaN is here deposited as a thin-film.

However the lattice mismatch of β-$Ga_2O_3$ on the (001) and (−201)-planes of β-$Ga_2O_3$ with GaN is 2.6% and 4.7%, respectively. Such lattice mismatch is a major problem for III-nitride thin film growth. To solve this problem, advanced buffer layers have to be used. Even then, the dislocation density can still be as high as $5 \times 10^7$ $cm^{-2}$ for an InGaN epilayer grown on the (−201) plane of β-$Ga_2O_3$ (M. M. Muhammed, et al, High-quality III-nitride films on conductive, transparent (−201)-oriented β-$Ga_2O_3$ using a GaN buffer layer, Scientific Reports 6, 27947, (2016).

There remains a need therefore to develop alternative compositions that solve the problem of lattice mismatch without the use of complex buffer layers. One solution is to use a substrate which is formed from the same material as the semi-conductor, e.g. a GaN substrate for a GaN semiconductor. Such substrates are however very expensive and would limit the transparency to the near UV (band gap 3.4 eV (365 nm)).

In order to overcome these problems this invention concerns the epitaxial growth of semiconductor nanostructures, especially III-nitride nanostructures, on β-$Ga_2O_3$ substrates and electronic devices such as LEDs comprising the composition. Rather than epitaxial growth of a thin film of semi-conductor group III-V material therefore, we propose a nanostructure, e.g. a nanowire or nanopyramid.

The bottom-up growth of nanostructures offers new opportunities to obtain high quality heteroepitaxial group III-nitride materials on β-$Ga_2O_3$. Unlike in the thin film solutions above, the inventors have appreciated that the lattice mismatch can be accommodated via the small cross-sectional area which the nanostructure has on the substrate. This induces elastic rather than plastic strain relaxation at the free surface extending into the nanostructure volume. The generated strain and possible misfit dislocations are confined to the nanostructure/substrate interface and do not affect the nanostructure itself. Thus, the crystal quality of the epitaxial material is nearly independent of the crystalline characteristics of the underlying substrate. As a consequence of its large aspect ratio, possible dislocation lines for nanostructure whose diameter exceeds its critical diameter tend to find its minimum energy by shortening its length in such a way that it bends towards the nanostructure sidewalls instead of propagating vertically in the [111] (for zinc blende III-V semiconductor nanostructures) or [0001] (for wurtzite III-V semiconductor nanostructures) direction. This allows the upper part of the nanostructure to be free from structural defects.

Since the crystal structure of β-$Ga_2O_3$ is monoclinic, with space group C2/m, the symmetry is very low and very different from other common semiconductor substrates that usually have a cubic or hexagonal crystal structures, which is one of the reasons it has not been considered as useful substrate until very recently. However on the (100) and (−201) planes of β-$Ga_2O_3$, the atomic arrangement is close to hexagonal and an epitaxial relation with the hexagonal atomic arrangement of the [111]-oriented zinc blende and [0001]-oriented wurtzite semiconductor crystals is possible. Whilst the lattice-mismatch is still too large for high quality thin film growth, the use of nanostructures offers a way of growing virtually dislocation-free semiconductor devices based on the β-$Ga_2O_3$ substrate Nanostructures can accommodate much more lattice mismatch than thin films due to their small footprint. Therefore, the growth of high quality, dislocation-free semiconductors nanostructures on the (100) and (−201) planes of β-$Ga_2O_3$ is proposed. This can be achieved without the need for any advanced buffer layers. This is particularly attractive for the growth of III-nitride nanostructures, where the β-$Ga_2O_3$ substrate can be used as a transparent and conductive electrode for LEDs, such as vertical flip-chip LEDs, in particular UV LEDs emitting as short as at ~280 nm.

SUMMARY OF INVENTION

Thus, viewed from one aspect the invention provides a composition of matter comprising at least one nanostructure grown epitaxially on an optionally doped β-$Ga_2O_3$ substrate, wherein said nanostructure comprises at least one group III-V compound.

Viewed from another aspect the invention provides a composition of matter comprising:

at least one core semiconductor nanostructure grown epitaxially on an optionally doped β-$Ga_2O_3$ substrate wherein said nanostructure comprises at least one group III-V compound;

a semiconductor shell surrounding said core nanostructure, said shell comprising at least one group III-V compound;

said core semiconductor nanostructure being doped to form a n-type or p-type semiconductor; and said shell being doped to form a p-type or an a n-type semiconductor opposite to said core; and an outer conducting coating surrounding at least part of said shell which forms an electrode contact.

Viewed from another aspect the invention provides a composition of matter comprising:

at least one semiconductor nanostructure grown epitaxially on an optionally doped β-Ga$_2$O$_3$ substrate wherein said nanostructure comprises at least one group III-V compound;

said semiconductor nanostructure being doped such that the nanostructure contains axial n-type and p-type semiconductor regions.

Viewed from another aspect the invention provides a process for preparing at least one nanostructure grown epitaxially on an optionally doped β-Ga$_2$O$_3$ substrate comprising the steps of:

(I) providing group III-V elements to the surface of an optionally doped β-Ga$_2$O$_3$ substrate; and (II) epitaxially growing at least one nanostructure from the surface of the β-Ga$_2$O$_3$ substrate.

Viewed from another aspect the invention provides a device, such as an electronic device, comprising a composition as hereinbefore defined, e.g. a solar cell or LED.

Viewed from another aspect the invention provides a LED device comprising:

a plurality of nanostructures grown epitaxially on a doped β-Ga$_2$O$_3$ substrate, said nanostructures having a p-n or p-i-n junction, a first electrode in electrical contact with said doped β-Ga$_2$O$_3$ substrate;

a second electrode in contact with the top of at least a portion of said nanostructures optionally in the form of a light reflective layer;

wherein said nanostructures comprise at least one group III-V compound semiconductor. In use, light is preferably emitted through the doped β-Ga$_2$O$_3$ substrate in a direction substantially parallel to but opposite from the growth direction of the nano structures.

Viewed from another aspect, the invention provides a light emitting diode device comprising:

a plurality of nanostructures grown epitaxially on a doped β-Ga$_2$O$_3$ substrate, preferably through the holes of an optional hole-patterned mask on said doped β-Ga$_2$O$_3$ substrate, said nanostructures having a p-n or p-i-n junction, a first electrode in electrical contact with said doped β-Ga$_2$O$_3$ substrate;

a light reflective layer in contact with the top of at least a portion of said nanostructures or in contact with a second electrode in electrical contact with the top of at least a portion of said nanostructures, said light reflective layer optionally acting as the second electrode;

a second electrode in electrical contact with the top of at least a portion of said nanostructures, said second electrode being essential where said light reflective layer does not act as an electrode;

wherein said nanostructures comprise at least one group III-V compound semiconductor; and wherein in use light is emitted from said device through the doped β-Ga$_2$O$_3$ substrate in a direction substantially opposite to said light reflective layer.

Viewed from another aspect, the invention provides a light emitting diode device comprising:

a plurality of nanostructures grown epitaxially on a doped β-Ga$_2$O$_3$ substrate, preferably through the holes of an optional hole-patterned mask on said substrate, said nanostructures having a p-n or p-i-n junction, a first electrode in electrical contact with said substrate;

a light reflective layer in contact with the top of at least a portion of said nanostructures, said light reflective layer optionally acting as the second electrode;

a second electrode in electrical contact with the top of at least a portion of said nanostructures, said second electrode being essential where said light reflective layer does not act as an electrode;

wherein said nanostructures comprise at least one group III-V compound semiconductor; and wherein in use light is emitted through the doped β-Ga$_2$O$_3$ substrate from said device in a direction substantially opposite to said light reflective layer.

Viewed from another aspect, the invention provides a nanostructured LED comprising a plurality of group III-V compound semiconductor nanostructures grown epitaxially on a doped β-Ga$_2$O$_3$ substrate; wherein each of the nanostructures protrudes from the substrate and each nanostructure comprises a p-n or p-i-n-junction;

the top part of at least a portion of said nanostructures is covered with a light-reflecting or transparent contact layer to form at least one contact to group of nanostructures;

an electrode is in electrical contact with said doped β-Ga$_2$O$_3$ substrate;

the light-reflecting or transparent contact layer is in electrical contact with the first electrode via said nanostructures.

Viewed from another aspect, the invention provides use of an LED device as hereinbefore defined as a LED, in particular in the UV region of the spectrum.

In a further embodiment, the invention relates to a photodetector. Rather than emitting light, the device of the invention can be adapted to absorb light and subsequently generate a photocurrent and hence detect light.

Thus, viewed from another aspect the invention provides a photodetector device comprising:

a plurality of nanostructures grown epitaxially on a doped β-Ga$_2$O$_3$ substrate, said nanostructures having a p-n or p-i-n junction, a first electrode in electrical contact with said doped β-Ga$_2$O$_3$ substrate;

a second electrode in contact with the top of at least a portion of said nanostructures optionally in the form of a light reflective layer;

wherein said nanostructures comprise at least one group III-V compound semiconductor; and wherein in use light is absorbed in said device.

Viewed from another aspect the invention provides a photodetector device, such as a UV photodetector device, comprising:

a plurality of nanostructures grown epitaxially on an n(p)-doped β-Ga$_2$O$_3$ substrate, said nanostructures being p(n)-doped;

a first electrode in electrical contact with said doped β-Ga$_2$O$_3$ substrate;

a second electrode in contact with the top of at least a portion of said nanostructures optionally in the form of a light reflective layer;

wherein said nanostructures comprise at least one group III-N compound semiconductor; and wherein in use light is absorbed in said device.

Viewed from another aspect the invention provides a nanostructured photodetector comprising a plurality of group III-V compound semiconductor nanostructures grown epitaxially on a doped β-Ga$_2$O$_3$ substrate; wherein each of the plurality of nanostructures protrudes from the substrate and each nanostructure comprises a p-n- or p-i-n-junction;

a top portion of each nanostructure or at least one group of nanostructures from the plurality of nanostructures is covered with a transparent contact layer to form at least one contact to group of nanostructures;

an electrode is in electrical contact with said doped β-$Ga_2O_3$ substrate;

the transparent contact layer is in electrical contact with the first electrode via the p-n or p-i-n-junction in said nanostructures.

Viewed from another aspect, the invention provides use of a photodetector device as hereinbefore defined as a photodetector, in particular in the deep UV region of the spectrum (a so called solar blind photodetector).

Definitions

By a group III-V compound is meant one comprising at least one ion from group III and at least one ion from group V. There may be more than one element present from each group, e.g. AlGaN (i.e. a ternary compound), AlInGaN (i.e. a quaternary compound), and so on. The designation Al(In)GaN implies either AlGaN or AlInGaN, i.e. that the presence of In is optional. Any element indicated in brackets may or may not be present.

The term nanostructure is used to apply to a nanowire or a nanopyramid.

The term nanowire is used herein to describe a solid, wire-like structure of nanometer dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered structures. The nanowires can be said to be in essentially in one-dimensional form with nanometer dimensions in their width or diameter and their length typically in the range of a few 100 nm to a few μm. Ideally the nanowire diameter is between 50 and 500 nm, however, the diameter can exceed few microns (called microwires).

Ideally, the diameter at the base of the nanowire and at the top of the nanowire should remain about the same (e.g. within 20% of each other).

The term nanopyramid refers to a solid pyramidal type structure. The term pyramidal is used herein to define a structure with a base whose sides taper to a single point generally above the centre of the base. It will be appreciated that the single vertex point may appear chamferred. The nanopyramids may have multiple faces, such as 3 to 8 faces, or 4 to 7 faces. Thus, the base of the nanopyramids might be a square, pentagonal, hexagonal, heptagonal, octagonal and so on. The pyramid is formed as the faces taper from the base to a central point (forming therefore triangular faces). The triangular faces are normally terminated with (1-101) or (1-102) planes. The triangular side surfaces with (1-101) facets could either converge to a single point at the tip or could form a new facets ((1-102) planes) before converging at the tip. In some cases, the nanopyramids are truncated with its top terminated with {0001} planes. The base itself may comprise a portion of even cross-section before tapering to form a pyramidal structure begins. The thickness of the base may therefore be up to 200 nm, such as 50 nm.

The base of the nanopyramids can be 50 and 500 nm in diameter across its widest point. The height of the nanopyramids may be 200 nm to a few microns, such as 400 nm to 1 micron in length.

It will be appreciated that the substrate preferably comprises a plurality of nanostructures. This may be called an array of nanostructures.

The term epitaxy comes from the Greek roots epi, meaning "above", and taxis, meaning "in ordered manner". The atomic arrangement of the nanowire is based on the crystallographic structure of the substrate. It is a term well used in this art. Epitaxially growth means herein the growth on the substrate of a nanowire that mimics the orientation of the substrate.

Epitaxial growth will preferably occur when the growth occurs from the (-201) or (100) plane of the β-$Ga_2O_3$ substrate.

Nanostructures can be grown using a catalyst if desired, e.g. via a vapour-metal catalyst assisted liquid-solid (VLS) method. It is preferred however if no catalyst is used. Selective area growth (SAG) is the most promising method for growing positioned nanostructures. This method is different from the metal catalyst assisted vapour-liquid-solid (VLS) method, in which metal catalyst act as nucleation sites for the growth of nanowires or nanopyramids. Other catalyst-free methods to grow nanostructures are self-assembly growth, spontaneous growth, and so on, where nanostructures are nucleated in random positions on the β-$Ga_2O_3$ substrate. These methods yield fluctuations in the length and diameter of the nanostructures.

The SAG method typically requires a mask with nanohole patterns on the substrate. The nanostructures nucleate in the holes of the patterned mask on the substrate. This yields uniform size and pre-defined position of the nanostructures. The term mask refers to the mask material that is directly deposited on the substrate. The mask material should ideally not absorb emitted light (which could be visible, UV-A, UV-B or UV-C) in the case of an LED or not absorb the entering light of interest in the case of a photodetector. The mask should also be electrically non-conductive. The mask could contain one or more than one material, which include $Al_2O_3$, $SiO_2$, $Si_3N_4$, $TiO_2$, $W_2O_3$, and so on. Subsequently, the hole patterns in the mask material can be prepared using electron beam lithography or nanoimprint lithography and dry or wet etching.

MBE is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure as described in detail below. Over time, the incoming atoms form a nanostructure.

MOVPE also called as metal organic chemical vapour deposition (MOCVD) is an alternative method to MBE for forming depositions on crystalline substrates. In case of MOVPE, the deposition material is supplied in the form of metal organic precursors, which on reaching the high temperature substrate decompose leaving atoms on the substrate surface. In addition, this method requires a carrier gas (typically $H_2$ and/or $N_2$) to transport deposition materials (atoms/molecules) across the substrate surface. These atoms reacting with other atoms form an epitaxial layer on the substrate surface. Choosing the deposition parameters carefully results in the formation of a nanowire or nanopyramid.

The notation n(p)-type doping implies n type or in the alternative p type doping. Where nanostructures comprise a p-n- or p-i-n-junction, the order of the junction is not specified. For example, a p-i-n junction can be present in a nanowire irrespective of whether the p or n doping region is nearest the substrate. In other words the terms p-n or p-i-n and n-p or n-i-p are the same.

DETAILED DESCRIPTION OF INVENTION

This invention concerns the epitaxial growth of nanostructures on a β-Ga$_2$O$_3$ substrate, especially a doped β-Ga$_2$O$_3$ substrate. The composition of the invention comprises both the substrate and the nanostructures grown epitaxially thereon.

Having a nanostructure grown epitaxially provides homogeneity to the formed material which may enhance various end properties, e.g. mechanical, optical or electrical properties.

Epitaxial nanostructures may be grown from gaseous or liquid precursors. Because the substrate acts as a seed crystal, the deposited nanowire can take on a lattice structure and orientation identical to those of the substrate. This is different from thin-film deposition methods which deposit polycrystalline or amorphous films, even on single-crystal substrates.

Substrate

The substrate for nanostructure growth is β-Ga$_2$O$_3$. The crystal structure is depicted in FIG. 5. FIG. 6 also provides details of this material. These substrates can be purchased in wafer sizes of 2" from commercial suppliers. The wafers are sufficiently thick that they are self-supporting and no separate support is required.

In order to prepare nanostructures of commercial importance, it is essential that these grow epitaxially on the substrate and without the formation of dislocations due to lattice mismatch. It is also ideal if growth occurs perpendicular to the substrate and ideally therefore in the [111] direction for zinc blende III-V semiconductor nanostructures or [0001] direction for wurtzite III-V semiconductor nanostructures. It is especially preferred if the nanostructures are grown from the (–201) plane of the β-Ga$_2$O$_3$ substrate.

There is no guarantee that growth is possible with a particular substrate where that substrate material is different from the nanostructure being grown. The present inventors have determined, however, that epitaxial growth is possible by determining a possible lattice match between the atoms in the semiconductor nanostructure and the atoms in the substrate. In particular, for GaN and β-Ga$_2$O$_3$ substrate with surface (100) or (–201) plane the lattice mismatch is 2.6% and 4.7%, respectively. It is preferred therefore if the lattice mismatch is less than 5%.

In order to initiate the III-nitride nanostructure growth, e.g. on the (100)-plane of β-Ga$_2$O$_3$, a nitridation step may be employed. This will substitute the oxygen atoms at the surface of the substrate with nitrogen so that the hexagonal arrangement of the underlying Ga atoms is exposed and a first nano-epitaxial GaN monolayer can be formed. Nitridation can be achieved using ammonia (NH$_3$) (using MOVPE or MBE growth methods) or nitrogen plasma source (using MBE growth methods). Temperatures above 800° C. and pressures of 10$^2$ Pa or more can be employed for the nitridation in ammonia (NH$_3$)-based MBE.

In the case of III-nitride nanostructures grown on the (–201)-plane of β-Ga$_2$O$_3$, a nitridation step might not be needed since the surface oxygen atoms already form the hexagonal arrangement needed to induce the first nano-epitaxial III-nitride monolayer.

When MBE is used, the III-nitride nanostructure can be grown after the optional nitridation step, at a typical temperature of around 800° C. using nitrogen plasma source under N-rich conditions (similar growth conditions to typical III-nitride nanostructure growth on sapphire or silicon substrates). When MOVPE is used, a few nm thin GaN buffer may first be grown at 450-550° C. in a nitrogen ambient, to prevent a chemical reaction of the β-Ga$_2$O$_3$ substrate with hydrogen above 600° C. Temperatures typically around 1000° C., and a flow rate of ammonia (NH$_3$) of around 5-100 sccm, in a hydrogen and/or nitrogen ambient can be used for the subsequent III-nitride nanostructure growth (similar growth conditions to typical III-nitride nanostructure growth on sapphire or silicon substrates).

Viewed from one aspect therefore, the invention allows for the substrate to be treated with a nitridation step before growth of the nanostructures. A nitridation step typically introduces a nitride layer a few nm thick, e.g. up to 5 nm thick, onto the substrate.

In an alternative to the nitridation process, a buffer/nucleation layer can be transferred, or grown on the substrate, e.g. a GaN buffer layer can be grown on top of the Ga$_2$O$_3$ at temperature around 550° C. to provide a surface on which nanowire growth is initiated. Buffer layers of interest are based on group III-V compounds, such as GaN. The thickness of the grown buffer layer can vary from one atomic thickness to even millimetre scale, such as 10 nm to 500 nm. The buffer layer can be applied by direct epitaxial growth or the buffer layer can be transferred on top of the β-Ga$_2$O$_3$ substrate, e.g. via a transfer method to place a GaN buffer layer on top of β-Ga$_2$O$_3$ substrate. The buffer layer is preferably a nitride. The buffer layer is preferably a binary nitride.

In one embodiment, a hole patterned mask layer is used on top of the substrate. Where such a mask layer is used, the buffer may be located on top of the substrate and within the holes of the hole patterned mask.

Viewed from one aspect therefore, the invention provides a composition of matter comprising at least one nanostructure grown epitaxially on a substrate comprising a group III-V compound buffer layer, such as a GaN buffer layer, and an optionally doped β-Ga$_2$O$_3$ layer, wherein said nanostructure comprises at least one group III-V compound.

Viewed from another aspect the invention provides a composition of matter comprising at least one nanostructure grown epitaxially on a substrate comprising an optionally doped β-Ga$_2$O$_3$ layer, said substrate carrying a hole patterned mask layer through which said nanostructures are grown, wherein said nanostructure comprises at least one group III-V compound and wherein the bottom of the holes of the hole patterned mask layer adjacent the substrate are coated in a group III-V compound buffer, such as a GaN buffer.

Viewed from another aspect, the invention provides a process for preparing at least one nanostructure grown epitaxially on an optionally doped β-Ga$_2$O$_3$ substrate comprising the steps of:

(I) providing group III-V elements to the surface of a β-Ga$_2$O$_3$ substrate having a group III-V compound buffer layer applied thereto; and (II) epitaxially growing at least one nanostructure from the surface of the substrate.

Alternatively, viewed, it could be considered that a buffer present within the holes of the mask forms part of the nanostructure.

Any buffer layer that is used preferably grows epitaxially on the substrate. It is possible to dope the buffer layer using doping techniques as herein described for other layers of the composition of matter, e.g. n-type dope the buffer layer. Doping of the buffer layer and/or corresponding doping of the β-Ga$_2$O$_3$ substrate can allow the formation of p-n or p-i-n junctions in the substrate/buffer layer structure and the nanostructures. It will be appreciated that the nanostructures are grown from the buffer layer surface of the substrate, i.e. the buffer layer provides a surface from which nanostructures can grow.

Before growing any buffer layer it is preferred if the substrate is thermally cleaned.

It is especially preferred if an epitaxial (Al, In)GaN buffer layer is used, especially an n-type epitaxial (Al, In)GaN buffer layer.

It will be appreciated that the β-Ga$_2$O$_3$ substrate is preferably doped. For most devices, the substrate will be doped, e.g. n-doped. This can be achieved by doping with Sn or Si by the substrate producer.

Growth of Nanostructures

In order to prepare nanostructures of commercial importance, it is preferred that these grow epitaxially on the substrate. It is also ideal if growth occurs epitaxially and perpendicular to the substrate and ideally therefore in the [111]-direction for zinc blende III-V semiconductors or [0001]-direction for wurtzite III-V semiconductor crystals.

The present inventors have determined that high-quality epitaxial III-V semiconductor nanostructure growth on the β-Ga$_2$O$_3$ substrate is possible due to the small lattice match between the atoms in the semiconductor and the atoms in the substrate and the small footprint of the nanostructure on the substrate.

In a growing nanopyramid, the triangular faces are normally terminated with (1-101) or (1-102) planes. The triangular side surfaces with (1-101) facets could either converge to a single point at the tip or could form a new facets ((1-102) planes) before converging at the tip. In some cases, the nanopyramids are truncated with its top terminated with {0001} planes.

Whilst it is ideal that there is no lattice mismatch between a growing nanostructure and the substrate, nanostructures can accommodate much more lattice mismatch than thin films. The nanowires or nanopyramids of the invention may have a lattice mismatch of up to about 10% with the substrate and epitaxial growth is still possible. Ideally, lattice mismatches should be 7.5% or less, e.g. 5% or less.

For some semiconductors like GaN (a=3.189 Å) and AlN (a=3.111 Å), the lattice mismatch is so small (<~5%) that excellent growth of these semiconductor nanowires or nanopyramids can be expected on the (100) and (−201) planes of β-Ga$_2$O$_3$.

Growth of nanostructures can be controlled through flux ratios. Group III-nitride nanopyramids are encouraged, for example if high N flux is employed.

The nanowires grown in the present invention may be from 250 nm to several microns in length, e.g. up to 5 μm, such as 2 μm. Preferably the nanowires are at least 1 μm in length. Where a plurality of nanowires are grown, it is preferred if they all meet these dimension requirements. Ideally, at least 90% of the nanowires grown on a substrate will be at least 1 micron in length. Preferably substantially all the nanowires will be at least 1 μm in length.

Nanopyramids may be 250 nm to 1 micron in height, such as 400 to 800 nm in height, such as about 500 nm.

Moreover, it will be preferred if the nanostructures grown have the same dimensions, e.g. to within 10% of each other. Thus, at least 90% (preferably substantially all) the nanostructures on a substrate will preferably be of the same diameter and/or the same length (i.e. to within 10% of the diameter/length of each other). Essentially, therefore the skilled man is looking for homogeneity and nanostructures that are substantially the same in terms of dimensions.

The length of the nanostructures is often controlled by the length of time for which the growing process runs. A longer process typically leads to a (much) longer nanowire or nanopyramid.

The nanowires have typically a hexagonal cross sectional shape. The nanowire may have a cross sectional diameter of 25 nm to several hundred nm (i.e. its thickness). Diameters typically will not exceed 400 nm, such as 200 nm. As noted above, the diameter is ideally constant throughout the majority of the nanowire. Nanowire diameter can be controlled by the manipulation of the ratio of the atoms used to make the nanowire as described further below.

Moreover, the length and diameter of the nanostructures can be affected by the temperature at which they are formed. Higher temperatures encourage high aspect ratios (i.e. longer and/or thinner nanowires or nanopyramids). The diameter can also be controlled by manipulating the nanohole opening size of the mask layer. The skilled man is able to manipulate the growing process to design nanostructures of desired dimensions.

The nanostructures of the invention are formed from at least one III-V compound semiconductor. Preferably, the nanostructure consists of group III-V compounds only optionally doped as discussed below. Note that there may be more than one different group III-V compound present but it is preferred if all compounds present are group III-V compounds.

Group III element options are B, Al, Ga, In, and Tl. Preferred options here are Ga, Al and In.

Group V options are N, P, As, Sb. All are preferred, especially N.

It is of course possible to use more than one element from group III and/or more than one element from group V. Preferred compounds for nanowire or nanopyramid manufacture include AlAs, GaSb, GaP, BN, GaN, AlN, AlGaN, AlGaInN, GaAs, InP, InN, InGaN, InGaAs, InSb, InAs, or AlGaAs. Compounds based on Al, Ga and In in combination with N are most preferred. The use of GaN, AlGaN, InGaN, AlInGaN or AlN is highly preferred.

It is most preferred if the nanostructures consist of Ga, Al, In and N (along with any doping atoms as discussed below).

Whilst the use of binary materials is possible, the use of ternary nanowires or nanopyramids in which there are two group III cations with a group V anion are preferred here, such as AlGaN. The ternary compounds may therefore be of formula XYZ wherein X is a group III element, Y is a group III different from X, and Z is a group V element. The X to Y molar ratio in XYZ is preferably 0.1 to 0.9, i.e. the formula is preferably $X_xY_{1-x}Z$ where subscript x is 0 to 1.

Quaternary systems might also be used and may be represented by the formula $A_xB_{1-x-y}C_yD$ where A, B and C are different group III elements and D is a group V element. Again subscripts x and y are typically 0 to 1. Other options will be clear to the skilled man.

The growth of GaN, AlGaN, InGaN and AlInGaN nanostructures is especially preferred. The wavelength of light emitted by a device containing these nanostructures can be tailored by manipulating the content of Al, In and Ga. Alternatively, the pitch and/or diameter of the nanowires or nanopyramids can be varied to change the nature of the light emitted.

It is further preferred if the nanowires or nanopyramids contain regions of differing compounds. The nanowire or nanopyramid might therefore contain a region of a first group III-V semiconductor such as GaN followed by a region of a different III-V semi-conductor such as AlGaN. Nanostructures can contain multiple regions such as two or more or three or more. These regions might be layers in an axially grown nanowire or shells in a radially grown nanowire or nanopyramid.

It is especially preferred if the group III-V semiconductor grows with a [111]-oriented zinc blende or [0001]-oriented wurtzite crystal structure.

Doping

The nanostructures of the invention are preferably doped, e.g. p-type doped, especially p-type and n-type doped, e.g. so as to contain a p-n or p-i-n junction. It is also possible to dope the substrate and dope the nanostructure to create a p-n junction between the two. Devices of the invention, especially those based on a p-i-n junction are therefore optionally provided with an undoped intrinsic semiconductor region between a p-type semiconductor and an n-type semiconductor region. The doped top part region is typically heavily doped because it is used for an ohmic contact. The doped $\beta$-$Ga_2O_3$ substrate will normally form the other ohmic contact in a device, which allows for a vertical device configuration.

It is therefore preferred that the nanowires or nanopyramids are doped. Doping typically involves the introduction of impurity ions into the nanowire or nanopyramid, e.g. during MBE or MOVPE growth. The doping level can be controlled from ~$10^{15}$/cm$^3$ to $10^{20}$/cm$^3$. The nanowires or nanopyramids can be p-doped or n-doped as desired. Doped semiconductors are extrinsic conductors.

The n(p)-type semiconductors have a larger electron (hole) concentration than hole (electron) concentration by doping an intrinsic semiconductor with donor (acceptor) impurities. Suitable donor (acceptors) for III-V compounds, especially nitrides, can be Si (Mg, Be and Zn). Dopants can be introduced during the growth process or by ion implantation of the nanowires or nanopyramids after their formation.

The nanostructures of the invention can be grown to have a heterostructured form radially or axially. For example for an axial heterostructured nanowire or nanopyramid, p-n junction can be axially formed by growing a p-type doped core first, and then continue with an n-doped core (or vice versa). The core of the nanostructure should normally have the same doping type as the $\beta$-$Ga_2O_3$ substrate (that is n(p)-type core on n(p)-type substrate). An intrinsic region can be positioned between doped cores for a p-i-n nanowire or nanopyramid. For a radially heterostructured nanostructure, p-n junction can be radially formed by growing the p-doped nanowire or nanopyramid core first, and then the n-doped semiconducting shell is grown (or vice versa). An intrinsic shell can be positioned between doped regions for a p-i-n nanowire or nanopyramid.

It is preferred if the nanostructures are grown axially and are therefore formed from a first section and a second section axially up the nanostructure. The two sections are doped differently to generate a p-n junction or p-i-n junction. The top or bottom section of the nanostructures is the p-doped or n-doped section.

In a p-i-n nanostructure, when charge carriers are injected into the respective p- and n-regions, they recombine in the i-region, and this recombination generates light. In a p-n junction case, recombination will occur in the space charge region (as there is no intrinsic region). The light is generated inside each nanowire or nanopyramid randomly and emitted in all directions. One problem with such a structure is that a substantial fraction of the generated light is wasted, as only a portion is directed in a desired direction.

The use therefore of a light reflective layer ensures that the emitted light is directed out from the device in a desired direction, in particular opposite to the reflective layer.

The nanostructures of the invention preferably grow epitaxially. They attach to the underlying substrate through a complex mixture of quasi van der Waals, ionic and covalent binding with the $\beta$-$Ga_2O_3$ substrate. Accordingly, at the junction of the substrate and the base of the nanowire or nanopyramid, crystal planes are formed epitaxially within the nanowire or nanopyramid. These build up, one upon another, in the same crystallographic direction thus allowing the epitaxial growth of the nanostructure. Preferably the nanowires grow vertically. The term vertically here is used to imply that the nanowires grow perpendicular to the substrate. It will be appreciated that in experimental science the growth angle may not be exactly 90° but the term vertically implies that the nanowires are within about 10° of vertical/perpendicular, e.g. within 5°. Because of the epitaxial growth via covalent bonding, it is expected that there will be an intimate contact between the nanostructures and the $\beta$-$Ga_2O_3$ substrate.

It will be appreciated that the substrate comprises a plurality of nanostructures. Preferably the nanostructures grow about parallel to each other. It is preferred therefore if at least 90%, e.g. at least 95%, preferably substantially all nanostructures grow in the same direction from the same plane of the substrate.

It will be appreciated that there are mainly two planes within the $\beta$-$Ga_2O_3$ substrate from which epitaxial growth could occur ((100) and (−201)). It is preferred if substantially all nanostructures grow from the same plane. It is preferred if that plane is parallel to the substrate surface. Ideally the grown nanostructures are substantially parallel. Preferably, the nanostructures grow substantially perpendicular to the $\beta$-$Ga_2O_3$ substrate.

The nanostructures of the invention should preferably grow in the [111]-direction for zinc blende III-V semiconductors or [0001]-direction for wurtzite III-V semiconductor crystals.

The nanostructures are preferably grown by MBE or MOVPE. In the MBE method, the substrate is provided with a molecular beam of each reactant, e.g. a group III element and a group V element preferably supplied simultaneously. A higher degree of control of the nucleation and growth of the nanostructures on the substrate might be achieved with the MBE technique by using migration-enhanced epitaxy (MEE) or atomic-layer MBE (ALMBE) where e.g. the group III and V elements can be supplied alternatively.

A preferred technique in case of nitrides is plasma assisted solid-source MBE, in which very pure elements such as gallium, aluminium, and indium are heated in separate effusion cells, until they begin to slowly evaporate. The rf-plasma nitrogen source is typically used to produce low energy beams of nitrogen atoms. The gaseous elements then condense on the substrate, where they may react with each other. In the example of gallium and nitrogen, single-crystal GaN is formed. The use of the term "beam" implies that evaporated atoms (e.g. gallium) and nitrogen atoms from the plasma source do not interact with each other or vacuum chamber gases until they reach the substrate. Ammonia ($NH_3$) might be needed for an initial nitridation step if the III-nitride nanostructures growth is done by MBE on the (100) plane of the $\beta$-$Ga_2O_3$ substrate.

MBE takes place in ultra high vacuum, with a background pressure of typically around $10^{-10}$ to $10^{-9}$ Torr. Nanostructures are typically grown slowly, such as at a speed of up to a few μm per hour. This allows nanostructures to grow epitaxially and maximises structural performance.

The nature of the light emitted is a function of the diameter and composition of the nanostructures. In order to tune the band gap of the nanostructure, temperature and fluxes can be used.

In the MOVPE method, the substrate is kept in a reactor in which the substrate is provided with a carrier gas and a metal organic gas of each reactant, e.g. a metal organic precursor containing a group III element and a metal organic precursor containing a group V element. The typical carrier gases are hydrogen, nitrogen, or a mixture of the two. A higher degree of control of the nucleation and growth of the nanostructures on the substrate might be achieved with the MOVPE technique by using pulsed layer growth technique, where e.g. the group III and V elements can be supplied alternatively.

Selective Area Growth of Nanowires or Nanopyramids

The nanostructures of the invention are preferably grown by selective area growth (SAG) method. This method may require a mask with nano-hole patterns deposited on the β-$Ga_2O_3$ substrate.

In order to prepare a more regular array of nanostructures with better homogeneity in height and diameter of grown nanostructures, the inventors envisage the use of a mask on the β-$Ga_2O_3$ substrate. This mask can be provided with regular holes, where nanostructures can grow homogeneously in size in a regular array across the substrate. The hole patterns in the mask can be easily fabricated using conventional photo/e-beam lithography or nanoimprinting. Thus a mask can be applied to the substrate and etched with holes exposing the substrate surface, optionally in a regular pattern. Moreover, the size and the pitch of the holes can be carefully controlled. By arranging the holes regularly, a regular pattern of nanostructures can be grown.

Moreover, the size of the holes can be controlled to ensure that only one nanostructure can grow in each hole. Finally, the holes can be made of a size where the hole is sufficiently large to allow nanostructure growth. In this way, a regular array of nanostructures can be grown.

By varying the size of the holes, one could control the size of the nanostructure. By varying the pitch of the holes, one could optimize the light extraction of light from the nanostructures.

The mask material can be any material which does not damage the underlying substrate when deposited. The mask should also be transparent to the emitted light (LED) and entering light (photodetector). The minimum hole size might be 50 nm, preferably at least 100-200 nm. The thickness of the mask can be 10 to 100 nm, such as 10 to 40 nm.

The mask itself can be made of an inert compound, such as silicon dioxide or silicon nitride. In particular, the hole-patterned mask comprises at least one insulating material such as $SiO_2$, $Si_3N_4$, $HfO_2$, $TiO_2$ or $Al_2O_3$ e.g. deposited by e-beam evaporation, CVD, PE-CVD, sputtering, or ALD. The mask can therefore be provided on the substrate surface by any convenient technique such as by electron beam deposition, CVD, plasma enhanced-CVD, sputtering, and atomic layer deposition (ALD).

The use of a Ti mask that is either nitridated/oxidized before the nanowire growth, is particularly preferred as such a mask has been found to allow growth of uniform nanostructures.

In a further embodiment, the invention may involve the transfer of a hole-patterned mask of graphene/$SiO_2$ or graphene/$Si_3N_4$ where graphene is closest to the $Ga_2O_3$ substrate. That is a mask with holes through both the graphene and the second layer (e.g. $SiO_2$ or $Si_3N_4$). Growth would happen through the holes from $Ga_2O_3$ and the mask would protect the rest of the $Ga_2O_3$ during growth.

The selective area growth method yields nanostructures of uniform length, and diameter at predefined positions. The nanostructures can also be grown without mask with nano-hole patterns. In such case, the nanostructures will have non-uniform sizes (length and diameter), and located at random positions.

For the nanostructure growth, the substrate temperature can then be set to a temperature suitable for the growth of the nanostructure in question. The growth temperature may be in the range 300 to 1000° C. The temperature employed is, however, specific to the nature of the material in the nanowire or nanopyramid and the used method (MBE vs. MOVPE). For example in MBE, a preferred temperature for GaN nanostructure growth is 700 to 950° C., e.g. 700 to 850° C., such as 765° C. For AlGaN the range is slightly higher, for example 800 to 980° C., such as 830 to 950° C., e.g. 850° C.

It will be appreciated therefore that the nanostructures can comprise different group III-V semiconductors within the nanostructure, e.g. starting with a GaN stem followed by an AlGaN component or AlGaInN component and so on.

For III-nitride nanostructure growth by MBE, it can be initiated by opening the shutter of the Ga effusion cell, the nitrogen plasma cell, and the dopant cell simultaneously initiating the growth of doped GaN nanowires or nanopyramids, hereby called as stem. The length of the GaN stem can be kept between 10 nm to several 100 s of nanometers. Subsequently, one could increase the substrate temperature if needed, and open the Al shutter to initiate the growth of AlGaN nanostructures. One could initiate the growth of AlGaN nanostructures on the substrate without the growth of GaN stem. n- and p- doped nanostructures can be obtained by opening the shutter of the n-dopant cell and p-dopant cell, respectively, during the nanostructure growth. For example, Si dopant cell for n-doping of nanostructures, and Mg dopant cell for p-doping of nanostructures.

The temperature of the effusion cells can be used to control growth rate in MBE. Convenient growth rates, as measured during conventional planar (layer by layer) growth, are 0.05 to 2 μm per hour, e.g. 0.1 μm per hour. The ratio of Al/Ga can be varied by changing the temperature of the effusion cells.

The pressure of the molecular beams can also be adjusted depending on the nature of the nanowire or nanopyramid being grown. Suitable levels for beam equivalent pressures are between $1 \times 10^{-7}$ and $1 \times 10^{-4}$ Torr.

The beam flux ratio between reactants (e.g. group III atoms and group V molecules) can be varied, the preferred flux ratio being dependent on other growth parameters and on the nature of the nanowire or nanopyramid being grown. In the case of nitrides, nanowires or nanopyramids are always grown under nitrogen rich conditions.

The nanostructures of the invention preferably comprise n-p or n-i-p Al(In)GaN or AlGaN nanowires or nanopyramids. The active layer (i-region) could consist of $Al_{x1}Ga_{y1}N$/ $Al_{x2}Ga_{y2}N$ (x1>x2 and x1+y1=x2+y2=1) multiple quantum wells or superlattice structure. The p-region could include/ comprise an electron blocking layer (single or multiple quantum barrier layers) to prevent the overflow of minority carriers (electrons) into the p-region.

It is thus a preferred embodiment if the nanostructure is provided with a multiple quantum well. It is thus a preferred embodiment if the nanostructure is provided with an electron blocking layer. Ideally, the nanostructure is provided with both an electron blocking layer and a multiple quantum well.

It is thus an embodiment of the invention to employ a multistep, such as two step growth procedure, e.g. to separately optimize the nanostructure nucleation and nanostructure growth on the β-Ga$_2$O$_3$ substrate.

A significant benefit of MBE is that the growing nanostructure can be analysed in situ, for instance by using reflection high-energy electron diffraction (RHEED). RHEED is a technique typically used to characterize the surface of crystalline materials. This technology cannot be applied so readily where nanostructures are formed by other techniques such as MOVPE.

A significant benefit of MOVPE is that the nanostructures can be grown at a much faster growth rate. This method favours the growth of radial heterostructure nanostructures and microwires, for example: n-doped GaN core with shell consisting of intrinsic AlN/Al(In)GaN multiple quantum wells (MQW), AlGaN electron blocking layer (EBL), and p-doped (Al)GaN shell. This method also allows the growth of axial heterostructured nanostructure using techniques such as pulsed growth technique or continuous growth mode with modified growth parameters for e.g., lower VIII molar ratio and higher substrate temperature. Nanostructures of the invention preferably comprise a radial or axial heterostructure.

In more detail, the MOVPE reactor must be evacuated after placing the sample, and is purged with N$_2$ to remove oxygen and water in the reactor. This is to avoid any damage to the β-Ga$_2$O$_3$ substrate at the growth temperatures, and to avoid unwanted reactions of oxygen and water with the precursors. The total pressure is set to be between 50 and 400 Torr. The substrate temperature can then be set to a temperature suitable for the growth of the nanowire or nanopyramid in question. In the initial growth step, a few nm-thin GaN buffer may be grown at 450-550° C. in a nitrogen ambient, to prevent a chemical reaction of the β-Ga$_2$O$_3$ substrate with hydrogen above 600° C. After the optional buffer layer the III-nitride nanostructure growth temperature may be in the range 700 to 1200° C. The temperature employed is, however, specific to the nature of the material in the nanostructure. For GaN, a preferred temperature is 800 to 1150° C., e.g. 900 to 1100° C., such as 1100° C. For AlGaN the range is slightly higher, for example 900 to 1250° C., such as 1050 to 1250° C., e.g. 1250° C.

The metal organic precursors can be either trimethylgallium (TMGa), or triethylgallium (TEGa) for Ga, trimethylalumnium (TMAl) or triethylalumnium (TEAl) for Al, and trimethylindium (TMIn) or triethylindium (TEIn) for In. The precursors for dopants can be SiH$_4$ for silicon and bis(cyclopentadienyl)magnesium (Cp$_2$Mg) or bis(methylcyclopentadienyl)magnesium ((MeCp)$_2$Mg) for Mg. The flow rate of TMGa, TMAl and TMIn can be maintained between 5 and 100 sccm. The NH$_3$ flow rate can be varied between 5 and 150 sccm.

In particular, the simple use of vapour-solid growth may enable nanostructure growth. Thus, in the context of MBE, simple application of the reactants, e.g. In and N, to the substrate without any catalyst can result in the formation of a nanostructure. This forms a further aspect of the invention which therefore provides the direct growth of a semiconductor nanostructure formed from the elements described above on a β-Ga$_2$O$_3$ substrate. The term direct implies therefore the absence of a catalyst to enable growth.

Viewed from another aspect the invention provides a composition of matter comprising a plurality of group III-V nanostructures grown epitaxially on a doped β-Ga$_2$O$_3$ substrate, preferably through the holes of a hole-patterned mask on said doped β-Ga$_2$O$_3$ substrate, said nanostructures comprising:

an n-doped region and a p-doped region optionally separated by an intrinsic region.

Said regions can be represented by layers within a nanostructure or shells on a core to create the nanostructure. Thus, the invention further provides a plurality of radial group III-V nanostructures grown epitaxially on a doped β-Ga$_2$O$_3$ substrate comprising, in this order, an n-doped core with shell comprising an intrinsic multiple quantum well, an electron blocking shell (EBL), and p-doped shell. The core of the nanostructure should normally have the same doping type as the β-Ga$_2$O$_3$ substrate (that is n(p)-type core on n(p)-type substrate). The n-region could include/comprise a hole blocking layer (single or multiple quantum barrier layers) to prevent the overflow of minority carriers (holes) into the n-region.

Reflective Layer/Electrode

It is preferred if the composition of the invention is used in an LED, preferably in flip chip arrangement. In order to create a device, the top of the nanostructures needs to comprise a top electrode and, for the LED embodiment preferably a reflective layer. In some embodiments, these layers can be one in the same.

The device is provided with two electrodes. A first electrode is placed in contact with the doped β-Ga$_2$O$_3$ substrate. That electrode might be based on a metal element such as Ni, Au, Ti, or Al or a mixture thereof or a stack thereof, such as a stack Ti/Al/Ni/Au. Often the first electrode will be the n electrode deposited on the n-doped β-Ga$_2$O$_3$ substrate. The electrode may be on either surface of the substrate, preferably on the opposite surface as the grown nanostructures to allow for a vertical device configuration.

A second electrode is placed as a top contact on top of the grown nanostructures. This electrode will often be the p-electrode. Suitable electrode materials include Ni, Ag, Pd and Cu. In particular, a Ni/Au stack could be used. This electrode might also act as a heat sink. As discussed below in further detail, the LED device of the invention is preferably in the form of a flip chip. The top contact electrode therefore sits at the bottom of the flip chip assembly. It is therefore preferred if the electrode either reflects light or is provided with a light reflective layer. The light reflective layer is ideally metallic. The light-reflecting contact layer can be formed in several ways, although using a PVD (Physical Vapour Deposition) method and well-known mask techniques is the preferred method. The reflector is preferably made of aluminum or silver, but other metals or metal alloys may also be used. The purpose of the light-reflecting layer is to prevent light from leaving the structure in a direction other than the preferred direction, and to focus the emitted light to one single direction. Additionally, the light-reflecting layer may function as a top contact electrode to the nanowires or nanopyramids. The light emitted by the LED is channeled in a direction opposite to the reflective layer, i.e. out the top of the flip-chip.

The reflective layer needs to reflect light and may also act as a heat sink. Suitable thickness are 20 to 400 nm, such as 50 to 200 nm.

In the photodetector embodiment, there is no need to use a reflective layer but such a layer could be used, perhaps to reflect incoming light onto the nanostructures to enhance photodetection.

In a preferred embodiment, the photodector is a UV photodetector. A so called solar-blind UVC photodetector could be useful for e.g. flame detection, UV radiation calibration and monitoring, chemical and biological analysis, and astronomical studies, etc. In particular, the photodetector device comprises:

a plurality of group III-N nanostructures grown epitaxially on an n(p)-doped β-$Ga_2O_3$ substrate, said nanostructures being p(n)-doped.

A first electrode may be in electrical contact with said doped β-$Ga_2O_3$ substrate, typically opposite to the nanostructures.

Preferably, this photodetector would be based on a lightly n-type doped (n-) β-$Ga_2O_3$ substrate with a heavily p-type (p++) doped GaN nanostructure grown on it. In this case the light absorbing region will be mainly in the β-$Ga_2O_3$ substrate, and with a band gap corresponding to 260 nm, it would only be sensitive to UVC (shorter wavelength than ~260 nm). The role of the p-GaN nanostructure is to make a high-quality epitaxial heterojunction with the β-$Ga_2O_3$ substrate so that the holes created in the n-type β-$Ga_2O_3$ depletion region after UVC light absorption can be transported efficiently out through the p-GaN nanostructure and into the p-electrode. The electrons created in the n-type β-$Ga_2O_3$ depletion region after UVC light absorption will be transported out through the n-type β-$Ga_2O_3$ substrate and into the n-electrode. Due to the low n-doping in the β-$Ga_2O_3$ substrate and the high doping in the p-GaN nanostructure almost all of the depletion region (photocurrent generating region) is in β-$Ga_2O_3$ with a very thin depletion region in the p-GaN nanostructure next to the substrate/p-GaN interface. Due to the very thin p-GaN depletion region, there should be very small photo-current generation in p-GaN (giving some minimal photocurrent "noise" from light absorption in UVA and UVB). Since it is very difficult to p-type dope β-$Ga_2O_3$ and thin-film p-GaN growth on β-$Ga_2O_3$ substrates have a very high defect density at the heterointerface, such device is not efficient today.

Filler

It is within the scope of the invention to use a filler to surround the flip chip assembly as long as the filler is transparent, e.g. to UV light. Filler may be present in the space between nanowires or nanopyramids and/or around the assembly as a whole. Different fillers might be used in the spaces between the nanowires or nanopyramids than in the assembly as a whole.

Applications

The invention primarily relates to LEDs, in particular UV LEDs and especially UV-A, UV-B, or UV-C LEDs. The LEDs are preferred designed as a so called "flip chip" where the chip is inverted compared to a normal device.

The whole LED arrangement can be provided with contact pads for flip-chip bonding distributed and separated to reduce the average series resistance. Such a nanostructured LED can be placed on a carrier having contact pads corresponding to the position of p-contact pads on the nanowire or nanopyramid and n-contact pads to the β-$Ga_2O_3$ substrate of the LED chip and attached using soldering, ultrasonic welding, bonding or by the use of electrically conductive glue. The contact pads on the carrier can be electrically connected to the appropriate power supply lead of the LED package.

Nanowire-based LED devices as such, are usually mounted on a carrier that provides mechanical support and electrical connections. One preferred way to construct a LED with improved efficiency is to make a flip-chip device. A light reflective layer with high reflectivity is formed on top of the nanowires or nanopyramids. Emitted light directed towards the top of the nanowires or nanopyramids is reflected when it encounters the reflective layer, thus creating a clearly dominating direction for the light leaving the structure. This way of producing the structure allows for a much larger fraction of the emitted light to be guided in a desired direction, increasing the efficiency of the LED. The invention therefore enables the preparation of visible LEDs and UV LEDs.

The invention also relates to photodetectors in which the device absorbs light and generates a photocurrent. The light reflective layer may reflect light entering the device back on to the nanowires or nanopyramids for enhanced light detection.

Other applications include solar cells and laser diodes.

The invention will now be further discussed in relation to the following non limiting examples and figures.

BRIEF DESCRIPTION OF THE FIGURES

The figures are not to scale.

Figure 1:
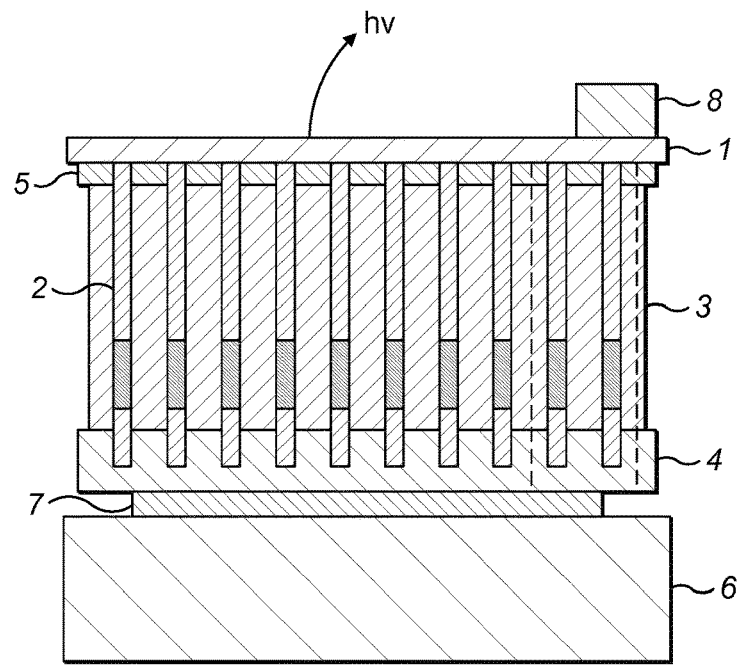
FIG. 1 shows a possible flip chip design. In use therefore, light is emitted through the top of the device (marked hu). Layer 1 is the β-$Ga_2O_3$ substrate.

Nanowires 2 are grown from substrate 1 epitaxially. Ideally, the β-$Ga_2O_3$ substrate is n-type doped and the nanowires are formed from Al(In)GaN, AlN or GaN and are doped to create n-i-p or n-p junctions.

A filler 3 can be positioned between grown nanowires. A top electrode/light reflecting layer 4 is positioned on top of nanowires 2. The light reflecting layer may also be provided with a p-electrode comprising Ni or Au. In use, this layer reflects any light emitted by the device to ensure that the light is emitted through the top of the device opposite the reflective layer. This is the so called flip-chip arrangement as the device is upside down compared to a conventional LED.

The n-electrode 8 is positioned on the substrate 1. That electrode might comprise Ti, Al, Ni or/and Au. The substrate may be provided with a mask 5 to allow growth of the nanowires in definitive positions on the substrate.

The whole device may be soldered to a submount 6 via solder layer 7.

When a forward current is passed vertically across the device, visible or UV light, dependent on composition of matter, is generated in the nanowires and is emitted, possibly after reflecting off the reflective layer out the top of the device.

When a reverse current is passed across the device and when the device is exposed to visible or UV light, the nanowires absorb the visible or UV light, dependent on composition of matter, and converts it into current, working as a photodetector.

Figure 2:
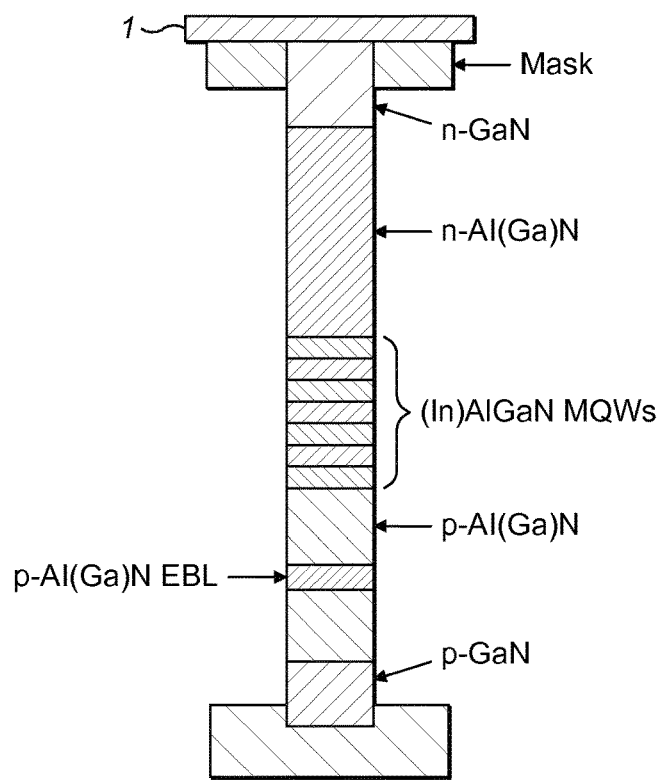

FIG. 2 shows a potential nanowire of the invention. The nanowire is provided with different components in an axial direction by variation of the elements being supplied during the growing phase. Initially, an n-type doped GaN material is deposited on the n-type doped β-$Ga_2O_3$ substrate, followed by n-AlN or n-(Al)GaN. In the central section of the nanowire as shown are a series of multiple quantum wells formed from (In)(Al)GaN. There follows the p-type doped region based on GaN, AlGaN or (Al)GaN, and an electron blocking layer based on p-Al(Ga)N and finally a highly doped p-GaN layer for ohmic contacting to a p-electrode.

Figure 3:
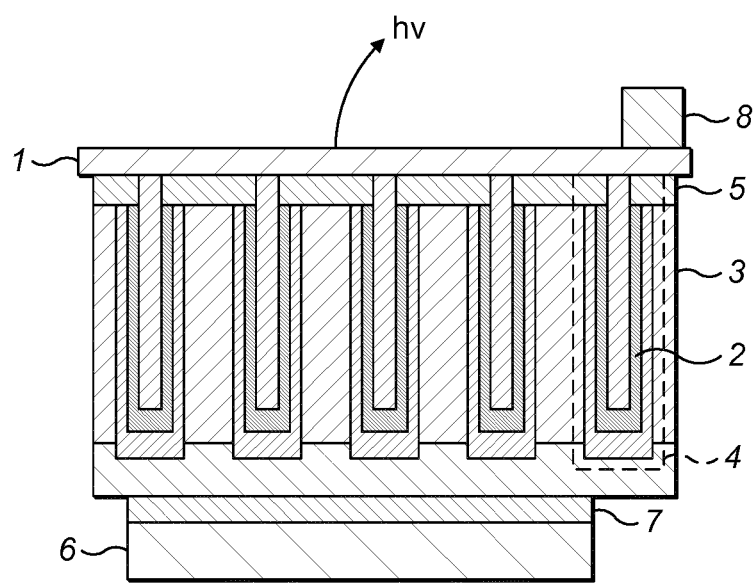

FIG. 3 shows an alternative chip design in which the nanowires are grown radially creating core shell structures. In use therefore, light is emitted through the top of the device (marked hu).

Layer 1 is the β-$Ga_2O_3$ substrate. Nanowires 2 are grown from substrate layer 1 epitaxially. Ideally, β-$Ga_2O_3$ substrate is n-type doped and the nanowires formed from Al(In)GaN, AlN or GaN and are doped to create n-i-p or n-p junctions. The substrate 1 can be provided with a mask layer 5.

A filler 3 can be positioned between grown nanowires. A top electrode/light reflecting layer 4 is positioned on top of nanowires 2. The light reflecting layer may also be provided with a p-electrode comprising Ni or/and Au. In use, this layer reflects any light emitted by the device to ensure that the light is emitted through the top of the device opposite the reflective layer. This is the so called flip chip arrangement as the device is upside down compared to a conventional LED.

An n-electrode 8 is positioned on the n-doped substrate 1. When a forward current is passed vertically across the device, visible or UV light, dependent on composition of matter, is generated in the nanowires and is emitted, possibly after reflecting off the reflective layer out the top of the device.

The whole device may be soldered to a submount 6 via solder layer 7.

When a reverse current is passed across the device and when the device is exposed to visible or UV light, the nanowires absorb the visible or UV light, dependent on composition of matter, and converts it into current, working as a photodetector.

Figure 4:
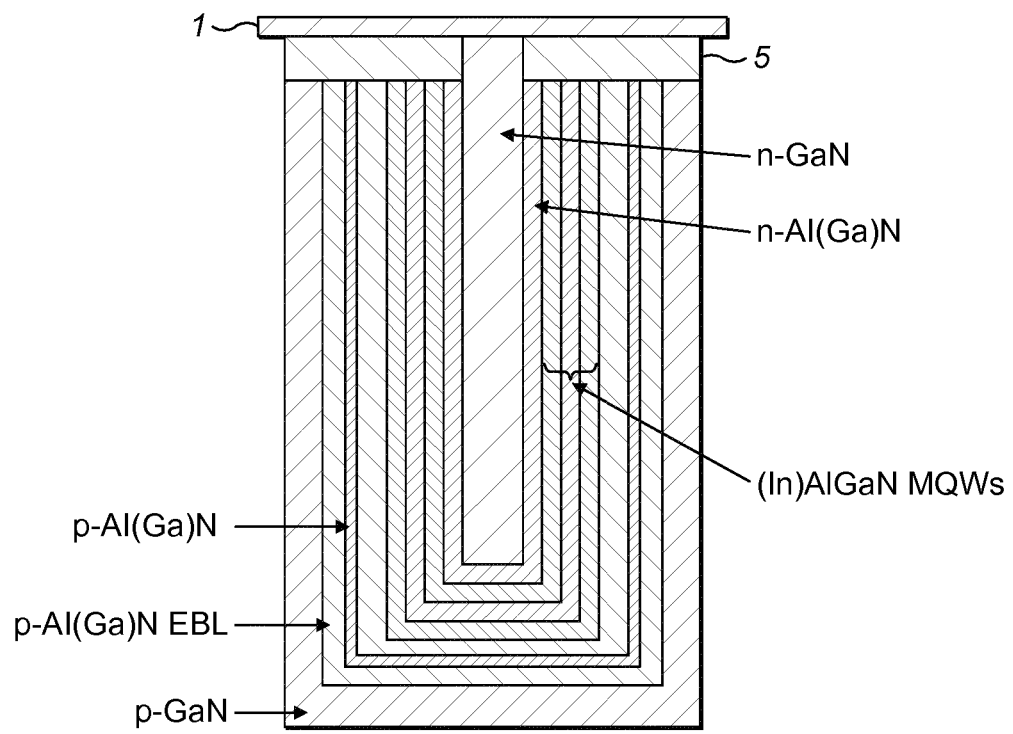

FIG. 4 shows a nanowire grown radially but having the same components as those of FIG. 2 in a shell arrangement. The nanowire is provided with different components in a radial direction by variation of the elements being supplied during the growing phase. Initially, an n-type doped GaN core material is deposited, followed by n-AlN or n-(Al)GaN. In the central shell of the nanowire as shown are a series of multiple quantum wells formed from (In)(Al)GaN. There follows the p-type doped region based on Al(Ga)N, and an electron blocking shell based on p-Al(Ga)N and finally a highly doped p-GaN shell for ohmic contacting of the p-electrode.

Figure 5:
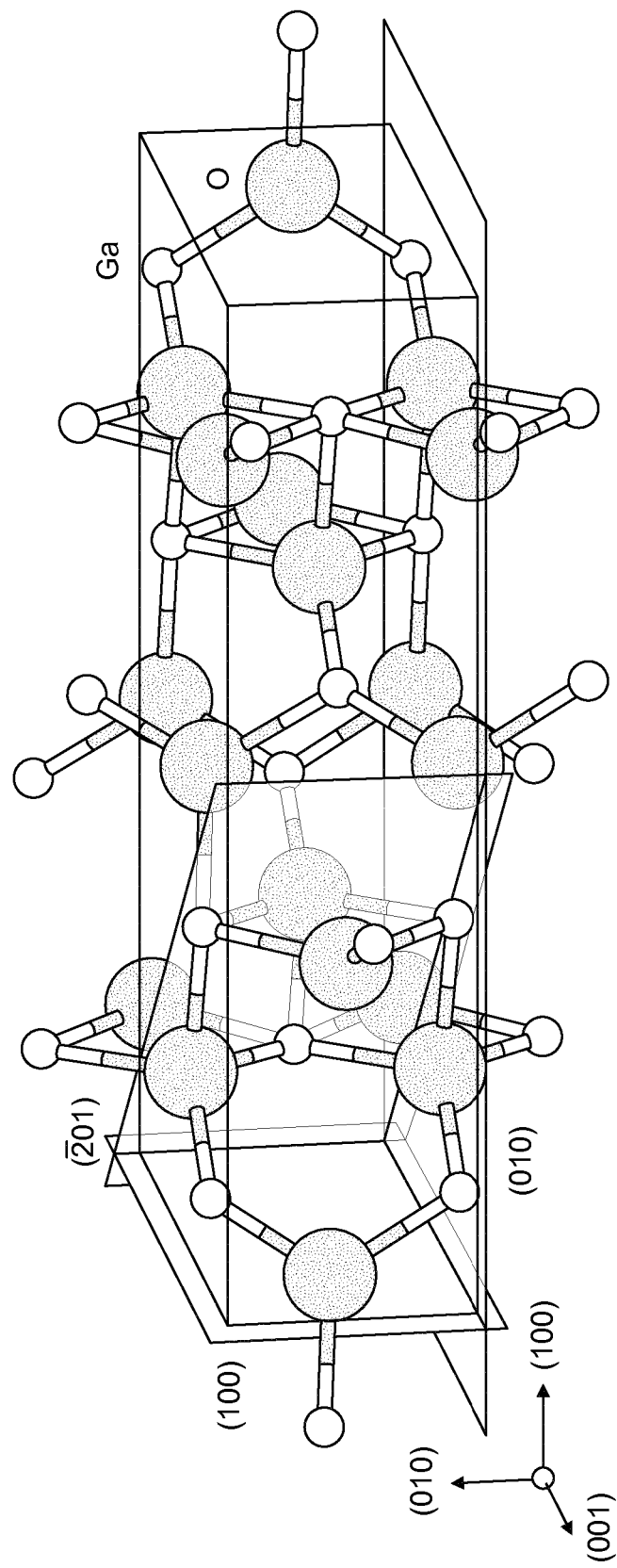

FIG. 5 shows the $\beta$-Ga$_2$O$_3$ unit cell with the (100), (−201), and (010), crystallographic planes shown in red, blue, and green, respectively. Oxygen atoms are shown in red and Ga atoms in green.

Figure 6:
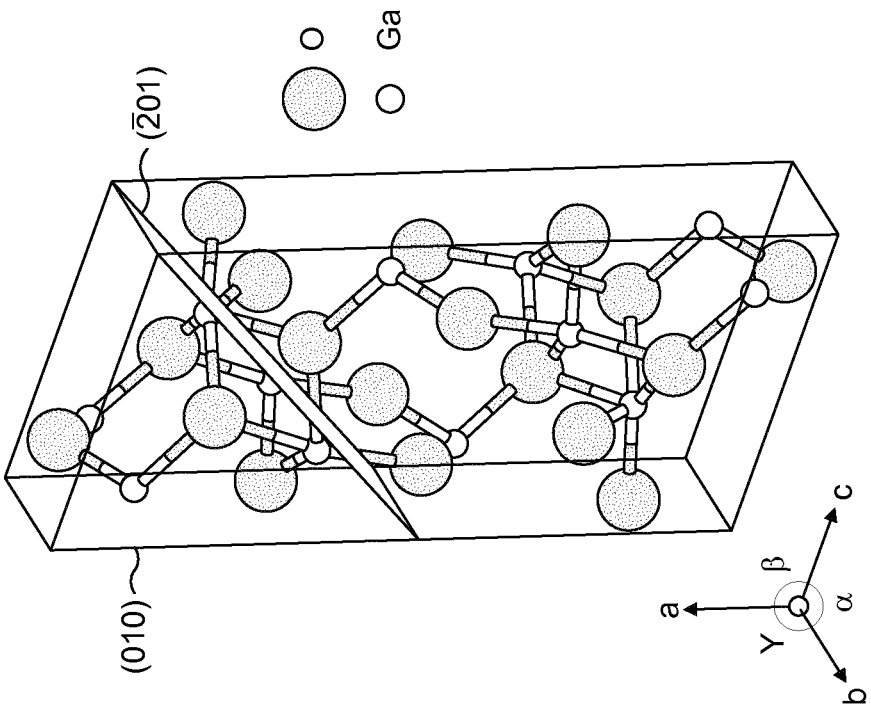

FIG. 6 show the $\beta$-Ga$_2$O$_3$ unit cell with the (−201) and (010) crystallographic planes as well as some physical properties of the $\beta$-Ga$_2$O$_3$ substrate. Oxygen atoms are shown in red and Ga atoms in green.

FIG. 7 shows the examples of (Al, In)GaN nanowires grown in the [0001] direction on a $\beta$-Ga$_2$O$_3$ substrate with (−201) surface orientation. Due to the very small lattice mismatch between $\beta$-Ga$_2$O$_3$ and (Al)GaN, i.e. [−201]/[0001], high-quality vertical (Al, In)GaN nanowires can be epitaxially grown on the (−201) surface of the $\beta$-Ga$_2$O$_3$ substrate. For specific applications, solar-blind photodetectors can be made from p-type (Al, In)GaN nanowires/n-type $\beta$-Ga$_2$O$_3$ substrate and LEDs can be fabricated from n-i-p (Al, In)GaN nanowires on top of the n-type $\beta$-Ga$_2$O$_3$ substrate.

Figure 7A:
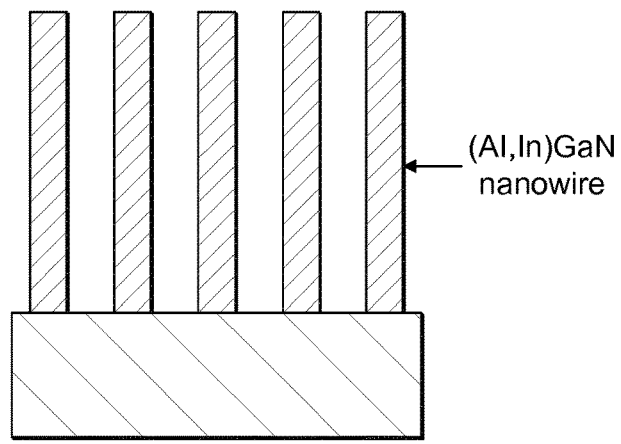
Figure 7B:
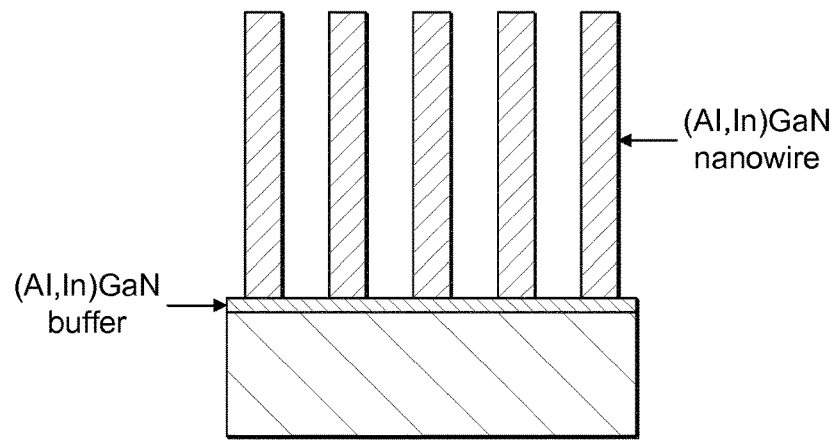

The (Al, In)GaN nanowires can be directly grown on top of $\beta$-Ga$_2$O$_3$ with (−201) surface orientation without (FIG. 7(a)) or with (FIG. 7(b)) a thin epitaxial III-V buffer layer. The buffer layer can be made of, e.g. (Al, In)GaN, as shown in FIG. 7 (b).

Figure 7C:
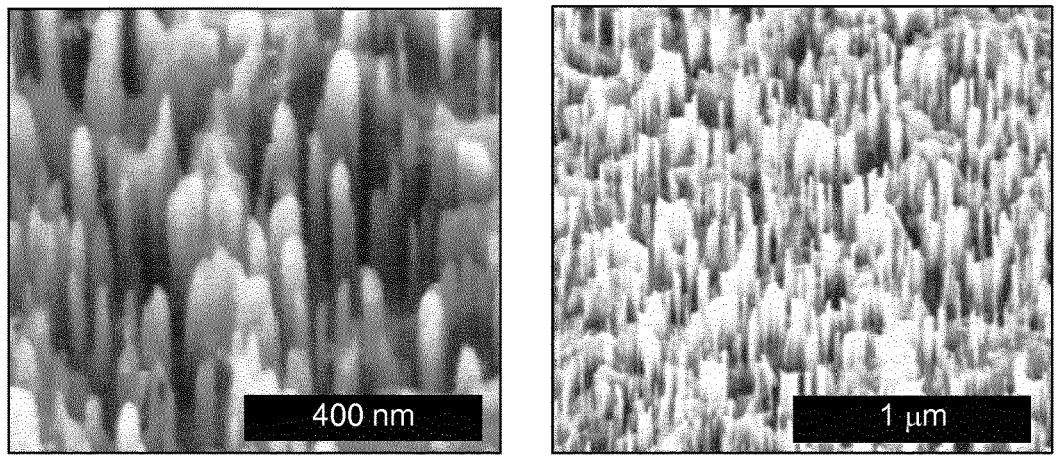

FIG. 7(c), shows the scanning electron microscopy (SEM) image of vertical n-type doped GaN nanowires grown on top of a (−201) $\beta$-Ga$_2$O$_3$ substrate with an n-type doped GaN buffer layer. The GaN nanowires and GaN buffer layer were grown with nitrogen plasma-assisted MBE as described in the Experimental Procedure section.

Figure 8A:
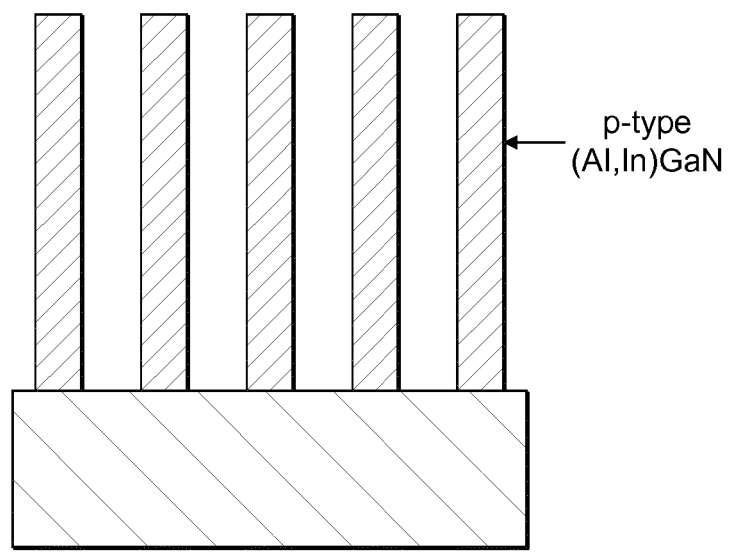

FIGS. 8(a) and (c), show p-type (Al, In)GaN nanowires epitaxially grown on an n-type $\beta$-Ga$_2$O$_3$ substrate without (a) and with (c) a p-type epitaxial (Al, In)GaN buffer layer, respectively. This forms p-n junctions between the n-doped Ga$_2$O$_3$ substrate and p-type (Al, In)GaN nanowires, which can be used as material for solar-blind photodiode detector.

Figure 8B:
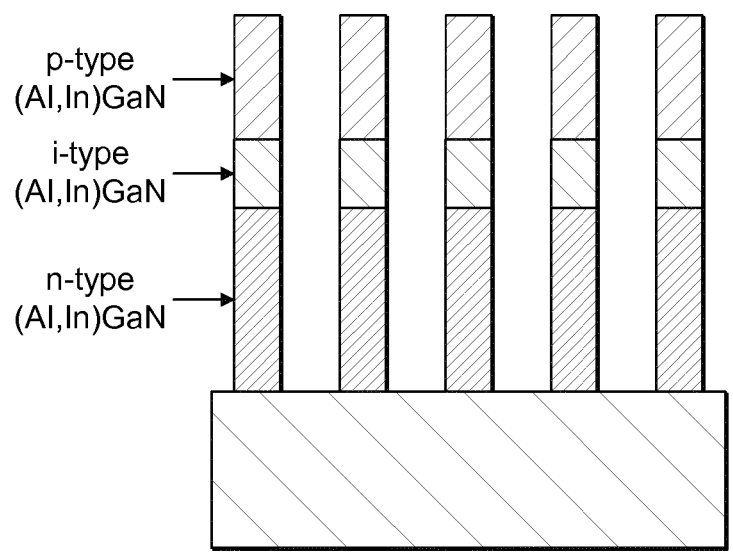
Figure 8C:
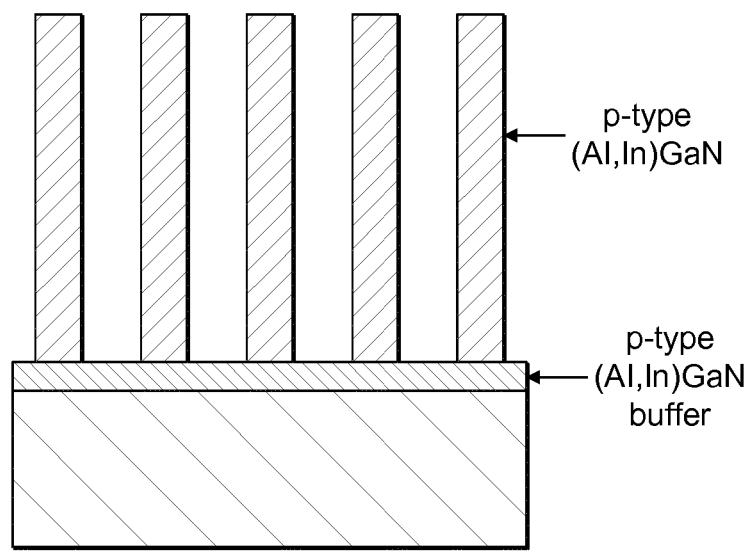
Figure 8D:
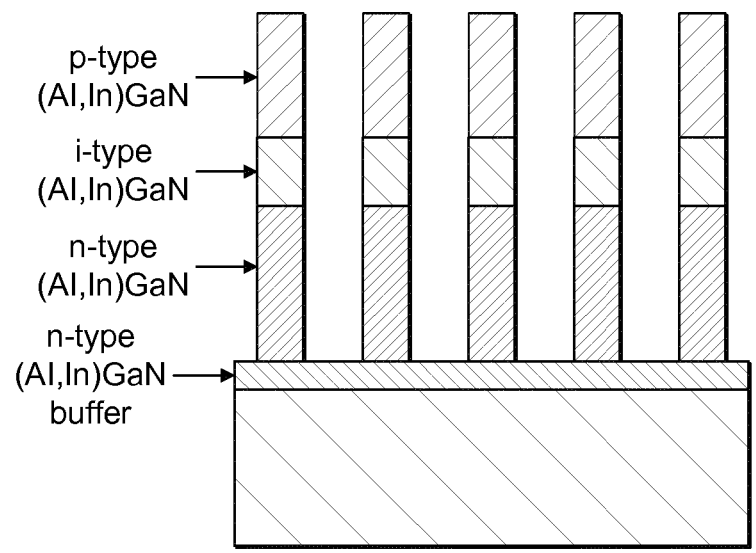

In FIGS. 8(b) and (d), n-i-p doped (Al, In)GaN nanowires are epitaxially grown on n-type $\beta$-Ga$_2$O$_3$ substrates without (b) and with (d) an epitaxial n-type (Al, In)GaN buffer layer, respectively. The Ga$_2$O$_3$ substrate can here e.g. act as a transparent (for photons with an energy up to the Ga$_2$O$_3$ bandgap ~4.8 eV) and conductive electrode for vertical current injection (Al, In)GaN nanowire LEDs.

EXAMPLE 1

N-type doped GaN nanowires have been grown on the (−201) plane of an n-doped $\beta$-Ga$_2$O$_3$ substrate under N-rich conditions in a Veeco GEN 930 molecular beam epitaxy system with a radio-frequency nitrogen plasma source (PA-MBE, equipped with an isolation gate valve). Prior to loading to the growth chamber, the substrate is thermally cleaned at 500° C. for 1 hour in a preparation chamber. An n-type doped GaN buffer layer was grown at 550° C. with Ga flux of 0.1 ML/s and N$_2$ flow of 2.5 sccm at 495 W for 60 min. The buffer growth was initiated by opening the Ga shutter and N$_2$ gate valve and shutter simultaneously. After the successful growth of the buffer layer, the substrate temperature was ramped up to 765° C. The nanowire growth was then initiated by opening the Ga shutter and N$_2$ gate valve and shutter simultaneously, and nanowire growth proceeded under a Ga flux of 0.5 ML/s and N$_2$ flow of 2.5 sccm at 495 W for 4 hours. The GaN buffer layer and nanowires are n-type doped with Si using a Si cell temperature of 1100° C.

EXAMPLE 2

N-doped GaN nanowires are grown on the (−201) plane of an n-doped $\beta$-Ga$_2$O$_3$ substrate using PA-MBE under N-rich conditions. A standard Knudsen effusion cell is used to supply Ga and Si atoms, while atomic nitrogen is generated from a radio-frequency plasma source that operates at 450 W. Prior to loading to the growth chamber, the substrate is thermally cleaned at 350° C. for 1 hour in a preparation chamber. Catalyst-free, self-assembled n-doped GaN nanowires are then grown directly on the n-doped $\beta$-Ga$_2$O$_3$ substrate, without any intermediate buffer layer. The growth process is initiated by opening the Ga and N$_2$ shutters simultaneously, i.e. no intentional nitridation takes place on the surface of the substrate. The GaN nanowires are n-type doped with Si using a cell temperature of 800° C. and a growth time of 90 minutes.

The invention claimed is:

1. A composition of matter comprising at least one nanostructure grown epitaxially on a doped or undoped $\beta$-Ga$_2$O$_3$ substrate,
   wherein said nanostructure comprises at least one group III-V compound;
   wherein said nanostructure grows from a (−201) or (100) $\beta$-Ga$_2$O$_3$ substrate plane; and
   wherein said nanostructure is grown in the absence of a catalyst.

2. The composition of matter of claim 1, wherein said at least one nanostructure is p-type doped.

3. The composition of matter of claim 1, wherein said at least one nanostructure comprises a radial or axial heterostructure.

4. The composition of matter of claim 1, wherein:
the at least one nanostructure comprises at least one core semiconductor nanostructure;
a semiconductor shell surrounding said core nanostructure, said shell comprising at least one group III-V compound; wherein
said core semiconductor nanostructure is doped forming an n-type or p-type semiconductor; and wherein
said shell is doped forming a p-type semiconductor or an n-type semiconductor opposite to said core; and
an outer conducting coating surrounding at least a part of said shell to form an electrode contact.

5. The composition of matter of claim 1, wherein said semiconductor nanostructure is doped forming axial n-type and p-type semiconductor regions.

6. The composition of matter of claim 1, wherein the nanostructure comprises a group III-N compound.

7. The composition of matter of claim 1, wherein the nanostructure comprises GaN, AlN, AlGaN, InGaN, or AlInGaN.

8. The composition of matter of claim 1, wherein said nanostructure is a nanowire or nanopyramid.

9. The composition of matter of claim 8, wherein said nanowire is no more than 400 nm in diameter and has a length of up to 5 microns.

10. The composition of matter of claim 1, wherein said substrate comprises a plurality of nanowires and wherein said plurality of nanowires are substantially parallel.

11. The composition of matter of claim 1, further comprising a doped or undoped group III-V buffer layer positioned between the substrate and the nanostructure.

12. The composition of matter of claim 11, wherein said buffer layer is doped or undoped GaN.

13. The composition of matter of claim 1, further comprising a hole patterned mask comprising a plurality of holes on the substrate and wherein said nanostructures grow through the plurality of holes of said mask.

14. The composition of matter of claim 1, further comprising a hole patterned mask comprising a plurality of holes on the substrate, a doped or undoped group III-V compound buffer layer present in the plurality of holes of said mask, and wherein said nanostructures grow from said buffer layer through the plurality of holes of said mask.

15. The composition of matter of claim 1, wherein the substrate comprises a doped or undoped group III-V compound buffer layer comprising a doped or undoped GaN buffer layer and a doped or undoped β-Ga$_2$O$_3$ layer.

16. The composition of matter of claim 1, wherein said substrate comprises a hole patterned mask layer comprising a plurality of holes through which said at least one nanostructure is grown,
and wherein a bottom of the plurality of holes of the hole patterned mask layer adjacent to the substrate is coated in a doped or undoped group III-V compound buffer.

17. A device, comprising the composition of claim 1.

* * * * *